US008724001B2

United States Patent
Ay

(10) Patent No.: US 8,724,001 B2
(45) Date of Patent: May 13, 2014

(54) ANALOG-TO-DIGITAL CONVERTER USING A RAMP GENERATOR

(75) Inventor: Suat Utku Ay, Moscow, ID (US)

(73) Assignee: University of Idaho, Moscow, ID (US)

(*) Notice: Subject to any disclaimer, the term of this patent is extended or adjusted under 35 U.S.C. 154(b) by 609 days.

(21) Appl. No.: 12/997,562

(22) PCT Filed: Jun. 25, 2009

(86) PCT No.: PCT/US2009/048670
§ 371 (c)(1),
(2), (4) Date: Dec. 10, 2010

(87) PCT Pub. No.: WO2009/158506
PCT Pub. Date: Dec. 30, 2009

(65) Prior Publication Data
US 2011/0080512 A1    Apr. 7, 2011

Related U.S. Application Data

(60) Provisional application No. 61/133,260, filed on Jun. 26, 2008.

(51) Int. Cl.
*H04N 5/335* (2011.01)
(52) U.S. Cl.
USPC .......................................................... 348/308
(58) Field of Classification Search
USPC ............................................................ 348/208
See application file for complete search history.

(56) References Cited

U.S. PATENT DOCUMENTS 7,114,063 B1* 9/2006 Fontaine et al. ............... 712/235
2002/0167611 A1* 11/2002 Boemler et al. ............... 348/572

FOREIGN PATENT DOCUMENTS

JP    60 112326 A    6/1985

OTHER PUBLICATIONS

Notification of Transmittal of the International Search Report and the Written Opinion of the International Searching Authority for PCT/US2010/040050, dated Feb. 14, 2011, 13 pages.
International Search Report issued in PCT/US2009/048670, dated Nov. 23, 2009, 3 pages.

* cited by examiner

*Primary Examiner* — Usman Khan
(74) *Attorney, Agent, or Firm* — Klarquist Sparkman, LLP

(57) ABSTRACT

An analog-to-digital (ADC) converter is disclosed that uses aspects of a single-slope ramp ADC, but with jump steps in the ramp voltage to increase speed. A look-ahead controller can cause a ramped voltage level to jump step and detect the number of analog input signals impacted due to the jump step. If the detected number is below a predetermined threshold, the ramp can be maintained from the new voltage level after the jump. If the detected number is above the predetermined threshold, the ramped voltage level can be returned to its original voltage level and trajectory. Thus, jump steps can be used to increase speed, but dynamic testing can be performed to ensure that error rates due to the jump step are minimized.

5 Claims, 32 Drawing Sheets

FIG. 29A $$d0 = \overline{q0} + q2$$

$$d1 = (q1 \cdot \overline{q0}) + (\overline{q2} \cdot q0 \cdot jump) + (done \cdot q2 \cdot q0 \cdot \overline{q1})$$

$$d2 = (q2 \cdot \overline{q0}) + (\overline{q2} \cdot q0 \cdot \overline{jump}) + (\overline{done} \cdot q2 \cdot q0)$$

FIG. 29B $$D0 = \left(\overline{\overline{q2} \cdot q0}\right) \cdot \overline{rst}$$

$$D1 = \left(\overline{\overline{(q1 \cdot \overline{q0})} \cdot \overline{(\overline{q2} \cdot q0 \cdot jump)} \cdot \overline{(done \cdot q2 \cdot q0 \cdot \overline{q1})}}\right) \cdot \overline{rst}$$

$$D2 = \left(\overline{\overline{(q2 \cdot \overline{q0})} \cdot \overline{(\overline{q2} \cdot q0 \cdot \overline{jump})} \cdot \overline{(\overline{done} \cdot q2 \cdot q0)}}\right) \cdot \overline{rst}$$

$$\text{Look} = \text{rst} + \overline{q2} \cdot \overline{q0} + q2 = \overline{\overline{\text{rst}} \cdot \overline{(q2 \cdot q0)} \cdot \overline{q2}}$$

$$\text{Cnt0} = (\overline{\text{rst}} \cdot q1) + (\overline{q2} \cdot q0 \cdot \overline{\text{rst}}) = \overline{\overline{(\overline{\text{rst}} \cdot q1)} \cdot \overline{(q2 \cdot q0 \cdot \overline{\text{rst}})}}$$

$$\text{Cnt1} = \text{rst} + (q2 \cdot q0) + (\overline{q2} \cdot \overline{q0} \cdot \overline{q1}) = \overline{\overline{\text{rst}} \cdot \overline{(q2 \cdot q0)} \cdot \overline{(q2 \cdot q0 \cdot q1)}}$$

$$\text{Cnt2} = \overline{\text{rst}} \cdot q0 \cdot \overline{q2} = \overline{\overline{\text{rst}} \cdot q0 \cdot \overline{q2}}$$

$$\text{Latch} = \overline{\text{rst}} \cdot q0 \cdot q1 = \overline{\overline{\text{rst}} \cdot q0 \cdot q1}$$

$$\text{C\_en} = \overline{\text{rst}} \cdot q0 \cdot \overline{q2} = \overline{\overline{\text{rst}} \cdot q0 \cdot \overline{q2}}$$

FIG. 32A
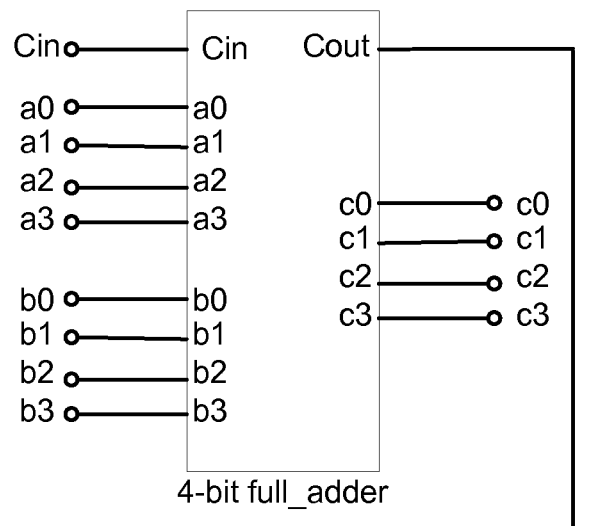
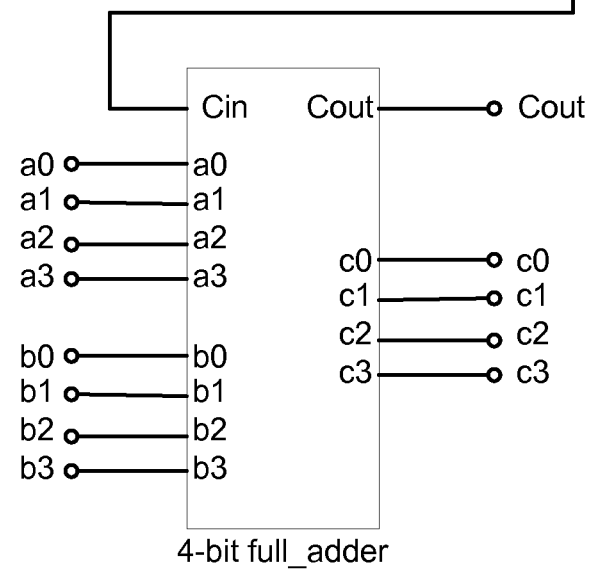

ANALOG-TO-DIGITAL CONVERTER USING A RAMP GENERATOR

CROSS REFERENCE TO RELATED APPLICATION

This is the U.S. National Stage of International Application No. PCT/US2009/048670, filed Jun. 25, 2009, which was published in English under PCT Article 21(2), which in turn claims the benefit of U.S. Provisional Patent Application No. 61/133,260, filed Jun. 26, 2008, and entitled "SINGLE-SLOPE LOOK-AHEAD-RAMP (SSLAR) ANALOG-TO-DIGITAL CONVERTER (ADC) FOR COLUMN PARALLEL CMOS IMAGE SENSOR", both applications of which are hereby incorporated by reference.

FIELD

The present application relates generally to analog-to-digital (ADC) converters and, more particularly, to an ADC that can be beneficial in CMOS image sensing.

BACKGROUND

Single-slope ramp analog-to-digital converters (SSR-ADC) are used in ICs for converting analog signals into digital. A simple SSR-ADC architecture 100 is shown in FIG. 1. A ramp generator 120 generates a sloping voltage level between two input voltages, $V_{low}$ and $V_{high}$. The ramp generator 120 is coupled to a comparator 140, which compares an analog input signal $V_{in}$, to be digitized, to the ramped input voltage from the ramp generator. An n-bit counter 160 (in this example, a 3 bit counter) is coupled to a latch 180. The latch 180 is responsive to a change in the output of the comparator 140 to latch a current value of a count from the counter 160. A timing diagram illustrates the operation in FIG. 2. In this example, the ramp signal is increased between 1 and 2 volts, while the analog input voltage Vin is set to 1.7 volt. The counter 160 starts counting in sync with the start of the ramp signal's increase in voltage. The latch 180 is transparent and "passes" counter digital bits to the data output as long as the ramp signal is below the analog input voltage Vin. Once the ramp voltage exceeds the input voltage, the comparator output voltage switches causing the latch to hold the last counter word, which represents the analog signal Vin in digital form.

One problem with SSR-ADCs is the analog-to-digital conversion speed. To convert an analog signal into a digital n-bit word, SSR-ADC requires $2^n$ times the master clock cycle. For example, a 10-bit representation of an analog signal can be converted into digital form after 1024 clock cycles. SSR-ADC is considered slow when compared with other ADC topologies, such as Flash ADC, which requires only 1 clock cycle for conversion, or Successive Approximation (SAR) ADC, which requires n-clock cycles for conversion.

SSR-ADC, however, is very suitable for column-parallel integration in image sensors, such as CMOS image sensors. One such image sensor is shown in FIG. 3. A pixel array 300 outputs row data onto shared column lines as controlled by a row decoder 320. Each column's pixel signal is read by an analog signal processor (ASP) 340, which passes the processed data to a plurality of ADCs 360. The ADCs 360 scanned by column decoder 380 sequentially output the data to a column bus 381, which is connected to a digital signal processor (DSP) 390. The DSP 390 processes and outputs the data in digital form. Column parallel architectures have m-number of ADCs integrated together, working in parallel to convert m-number of analog signals at the same time using global analog ramp and global digital counter signals.

FIG. 4 shows the structure of the SSR-ADCs 360 integrated in CMOS image sensor columns. As can be seen, only one ramp generator 400 is used to provide a ramp signal to multiple comparators 420 coupled in parallel. A global counter 440 is coupled to m, n-bit transparent digital latches 460. Although the SSR-ADC operates at a much slower speed than SAR-ADC or Flash ADC, it requires much less power and requires smaller integrated circuit (IC) area. Nonetheless, it is desirable to increase the speed of ADCs used in image sensors, while maintaining the benefits of SSR-ADCs.

SUMMARY

A method and apparatus are disclosed for increasing the speed of an analog-to-digital converter (ADC). One application of the ADC is in a column-parallel CMOS image sensor.

In one embodiment, a look-ahead controller can be used to jump step a ramped voltage level from a first voltage level to a second voltage level. A test can then be performed to detect the number of analog input signals impacted due to the jump step (i.e., the number of analog input signals between the first and second voltage levels). If the detected number is below a predetermined threshold, then the ramp can be maintained from the new voltage level after the jump. If the detected number is above the predetermined threshold, then the ramped voltage level can be returned to the first voltage level so that the analog input signals can be digitized using the ramped voltage level from its original level and trajectory. Consequently, the ADC uses components of a single-slope ramp ADC, but with one or more jump steps in order to increase speed.

In another embodiment, if the detected number is below the predetermined threshold, then an estimate of the voltage levels can be made for the analog input signals impacted due to the jump step. For example, an average voltage level between the first and second voltage levels can be used as an estimate of the digitized voltage level.

The foregoing features and advantages will become more apparent from the following detailed description, which proceeds with reference to the accompanying figures.

BRIEF DESCRIPTION OF THE DRAWINGS

FIG. 29 is an example of D-type flip flops direct synthesis for rst=0 and optimized final synthesis for implementation.

FIG. 30 is a K-mapping of the FSM output signals for synthesis.

FIG. 31 is an implementation of FSM output signals.

FIGS. 32A and 32B are an 8-bit carry look-ahead adder and a 4-bit carry look-ahead adder circuit.

DETAILED DESCRIPTION

As used herein, the singular terms "a," "an," and "the" include plural referents unless context clearly indicates otherwise. Similarly, the word "or" is intended to include "and" unless the context clearly indicates otherwise. Also, as used herein, the term "comprises" means "includes." Hence "comprising A or B" means including A, B, or A and B. Although many methods and materials similar or equivalent to those described herein can be used, particular suitable methods and materials are described below. In case of conflict, the present specification, including explanations of terms, will control. In addition, the materials, methods, and examples are illustrative only and not intended to be limiting.

Figure 1:
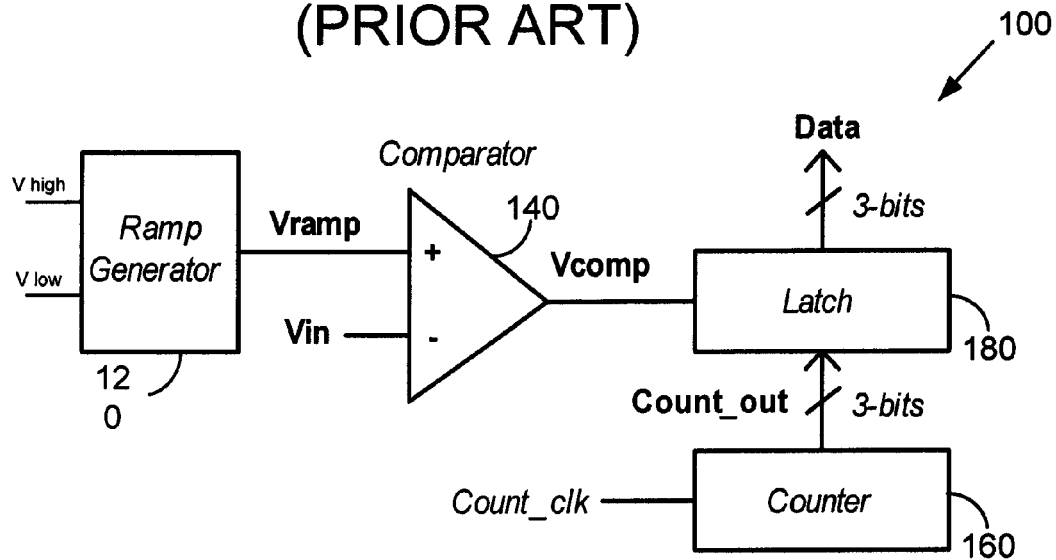
FIG. 1 is a circuit diagram of a conventional single slope ADC.
Figure 2:
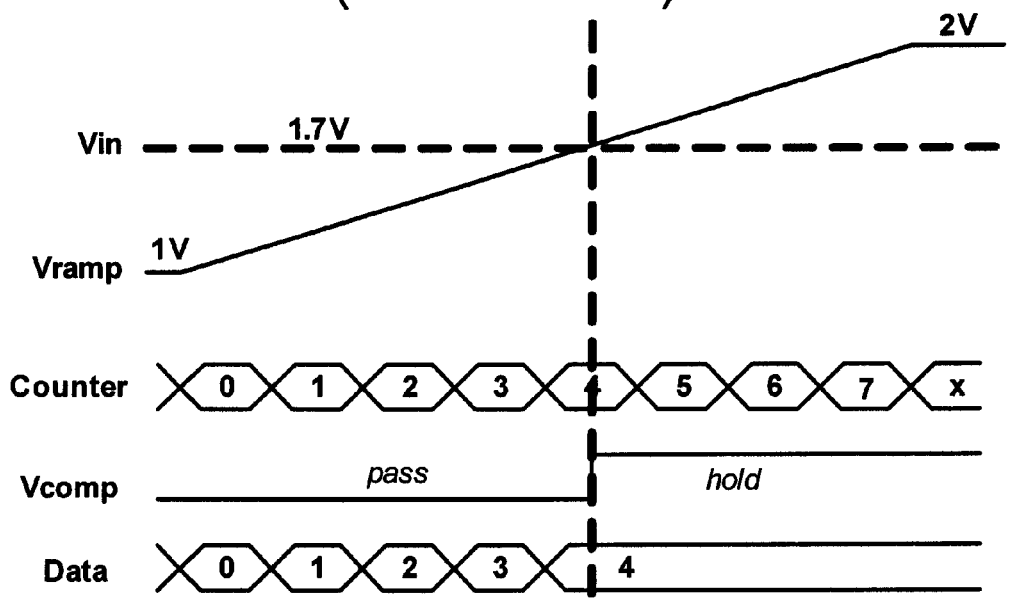
FIG. 2 is a timing diagram of the operation of the ADC of FIG. 1.
Figure 3:
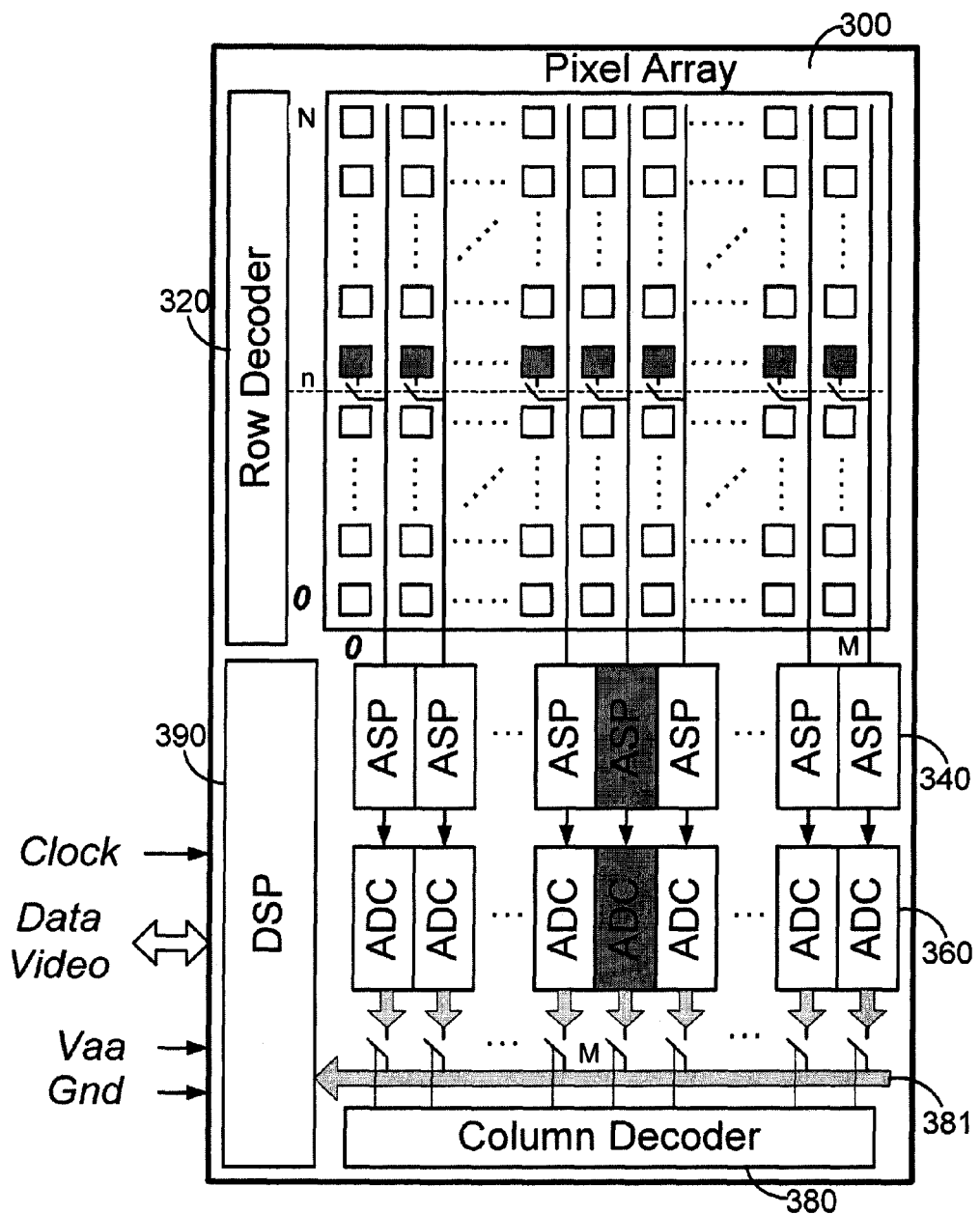
FIG. 3 is circuit diagram of a conventional CMOS image sensor with a column parallel architecture.
Figure 4:
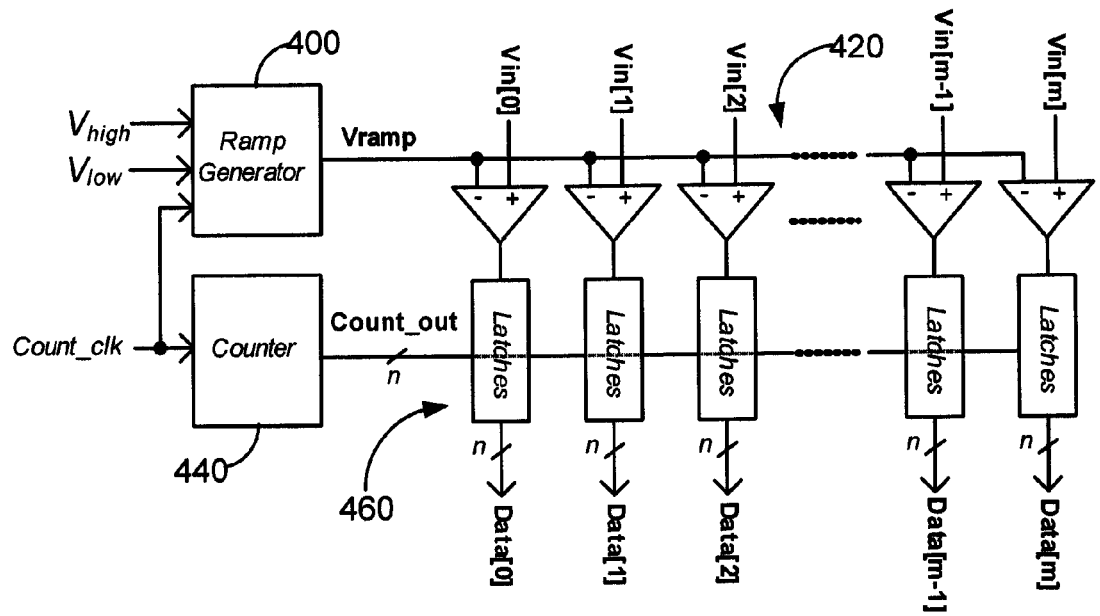
FIG. 4 is a circuit diagram of a conventional single slope ADC used in the CMOS image sensor of FIG. 3.
Figure 5:
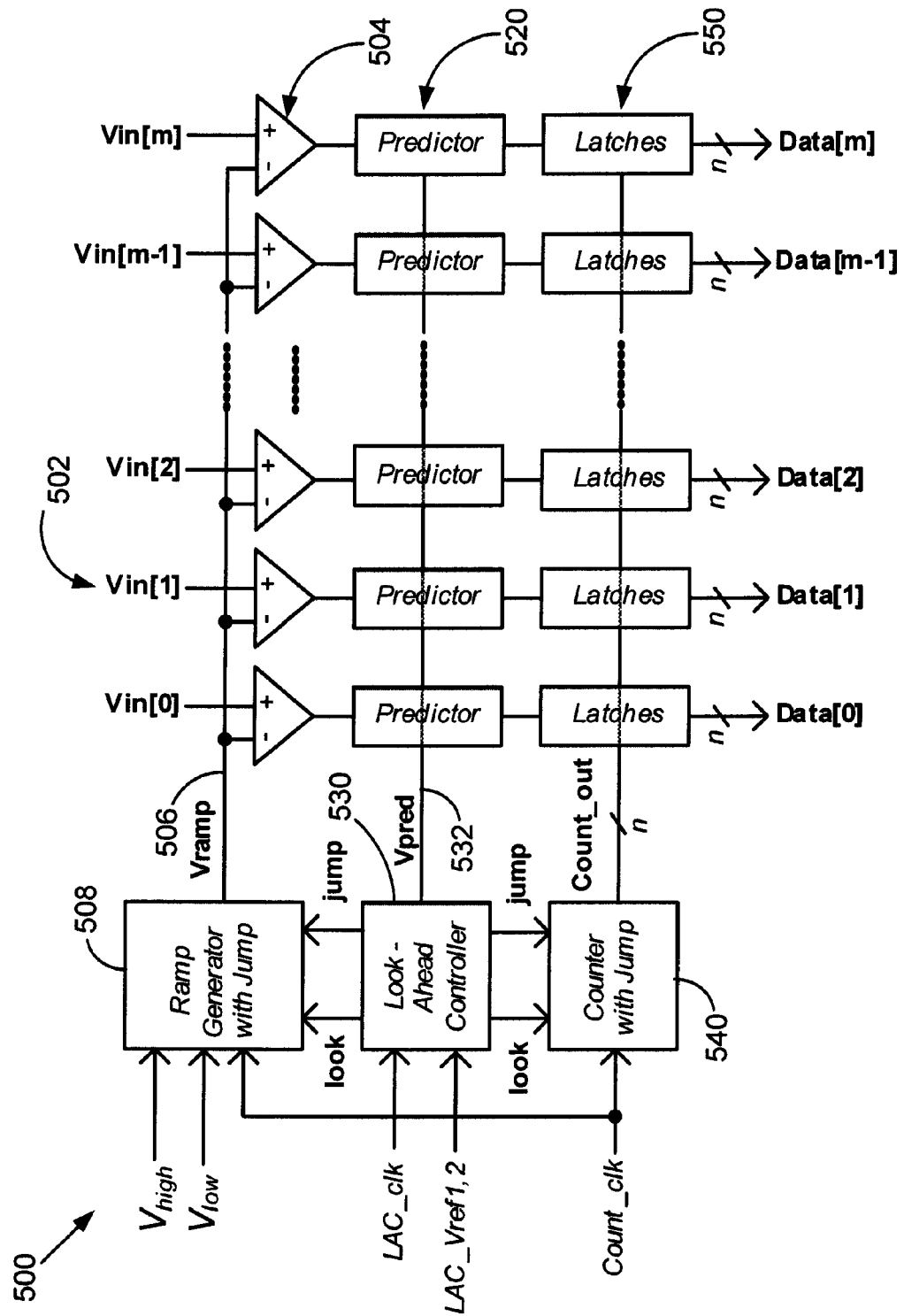
FIG. 5 is a circuit diagram of an ADC, in accordance with one embodiment of the present disclosure, with a predictor circuit and a look-ahead controller.

FIG. 5 is a circuit diagram 500 of an ADC that can be used in the CMOS image sensor of FIG. 3 or other such image sensors. Input voltage signals 502 can be coupled to columns of a pixel array, such as the pixel array 300. A plurality of comparators 504 (desirably, one per column) can have a first input coupled to the input voltage signals (such as on the positive terminal), while the second inputs (such as the negative terminal) can be coupled to a common Vramp signal line 506. The Vramp signal line 506 provides a Vramp signal from a ramp generator 508, as further described below. The plurality of comparators 504 have comparator outputs coupled to a plurality of predictor circuits 520 in a one-to-one fashion. As further described below, the predictor circuits 520 determine a number of comparator output signals that are affected by a jump step in the Vramp signal. A change in the comparator signal also indicates that the input voltage level associated with the comparator is somewhere between a low and high value of the jump step. In this sense, digitizing of the input voltage level is impacted by the jump step in that it was not properly converted to digital using a constant ramping voltage. The predictor circuit can detect a change in the comparator outputs due to the Vramp signal exceeding one or more Vin signals. If the number of input voltage signals 502 impacted by the jump step exceeds a predetermined threshold, then the jump in the Vramp signal can cause the error rate to be higher than desired. As a result, corrective action can be taken, such as returning the Vramp signal to the state it was before the jump occurred. The decision of whether to proceed with the jump or to jump back is made in a look-ahead controller circuit 530. In particular, outputs of the predictor circuits 520 are coupled together and to a Vpred signal line 532, which can be input into the look-ahead controller circuit 530. The look-ahead controller circuit 530 is coupled to both the ramp generator 508 and a counter 540. In any event, the predictor circuits 520 pass the comparator outputs to a plurality of latches 550. When the Vramp signal 506 exceeds one of the input voltage signals 502, the comparator 504 associated with that particular input voltage signal switches state causing the associated latch 550 to latch a current value of the counter 540, which represents the digital equivalent of the input voltage signal. It should be recognized that the desired structure is to have one comparator, one predictor and n-number of latches per column.

As described in more detail below, the look-ahead controller 530 uses the input signal on the Vpred signal line 532 in order to decide whether to maintain a jump ahead or to jump back. During an initial period, the ramp generator 508 can begin to ramp its output voltage at a substantially constant rate of increase. For example, on each clock cycle, the voltage may increase a predetermined amount (a discrete step). The look-ahead controller 530 can instruct the ramp generator 508 to jump ahead and can instruct the counter 540 to jump ahead. By jumping, the ramp generator does a step in voltage, rather than a continuous ramping. For example, the ramp generator can change the Vramp signal from a first voltage (e.g., 1 V) to a second voltage (2 V). Such a jump represents an increase of a multiple of the discrete steps so that the rate of increase is no longer constant. Additionally, jumping in the counter changes the counter count by more than one unit. For example, the count can change from 1 to 5, rather than from 1 to 2. When a jump in voltage occurs, certain of the comparators 504 will likely be affected causing them to change state. The predictor circuits 520 can detect a number of the comparator outputs that change state and report the same, on the Vpred line, to the look-ahead controller 530. If the number of comparators affected exceeds a predetermined threshold, the look-ahead controller 530 can instruct the ramp generator 508 to jump back to its pre jump level (e.g., from 2V to 1V) and the ramp generator proceeds to ramp at a constant rate. Likewise, the counter can be instructed to jump back to its previous pre jump count value (e.g., from 5 to 1). If the number affected does not exceed the predetermined threshold, then the look-ahead controller maintains the ramp generator 508 and the counter 540 at the jump-ahead states.

Figure 6:
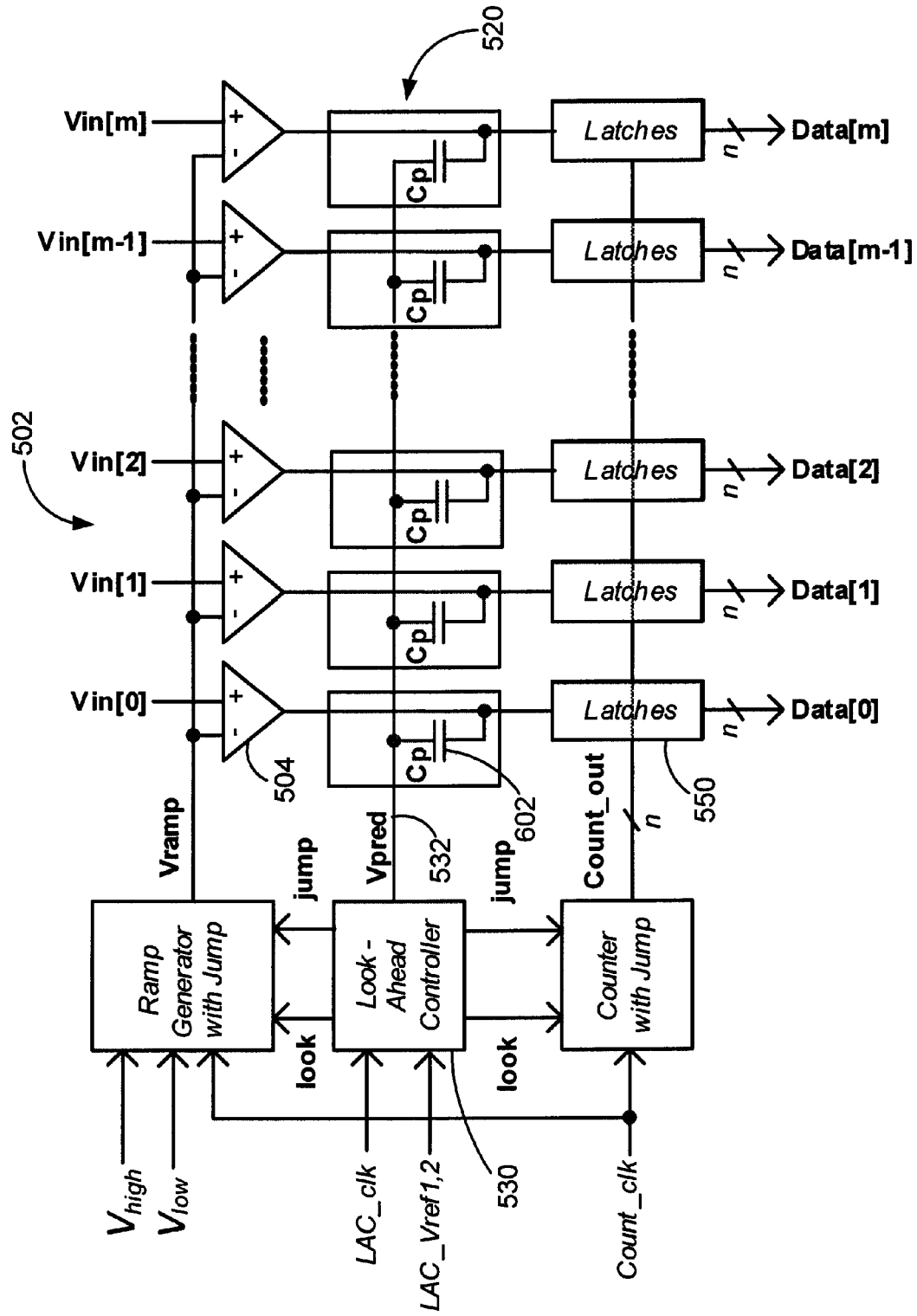
FIG. 6 is a more detailed circuit diagram of the predictor circuit that can be used in the ADC of FIG. 5.

FIG. 6 shows an embodiment of the predictor circuits 520. In this embodiment, the predictor circuits are capacitors 602 having one end thereof tied to the Vpred signal line 532 and the opposite end to a signal line extending between an output of the comparator 504 and an input of a latch 550. In this connection scheme, the predictor circuits 520 passively monitor the comparator outputs without changing or delaying the same. In operation, the Vpred line is charged to a certain voltage level that is changed each time the Vramp signal exceeds the Vin signals 502 from the pixel array. More particularly, each change in a comparator output changes a voltage level on the capacitor 602 extending between the comparator output and the Vpred line. Each capacitor associated with a column is coupled to the Vpred signal line 532 so that the look-ahead controller 530 can detect the number of predictor circuits 520 that were affected due to a jump in the Vramp voltage.

Figure 7:
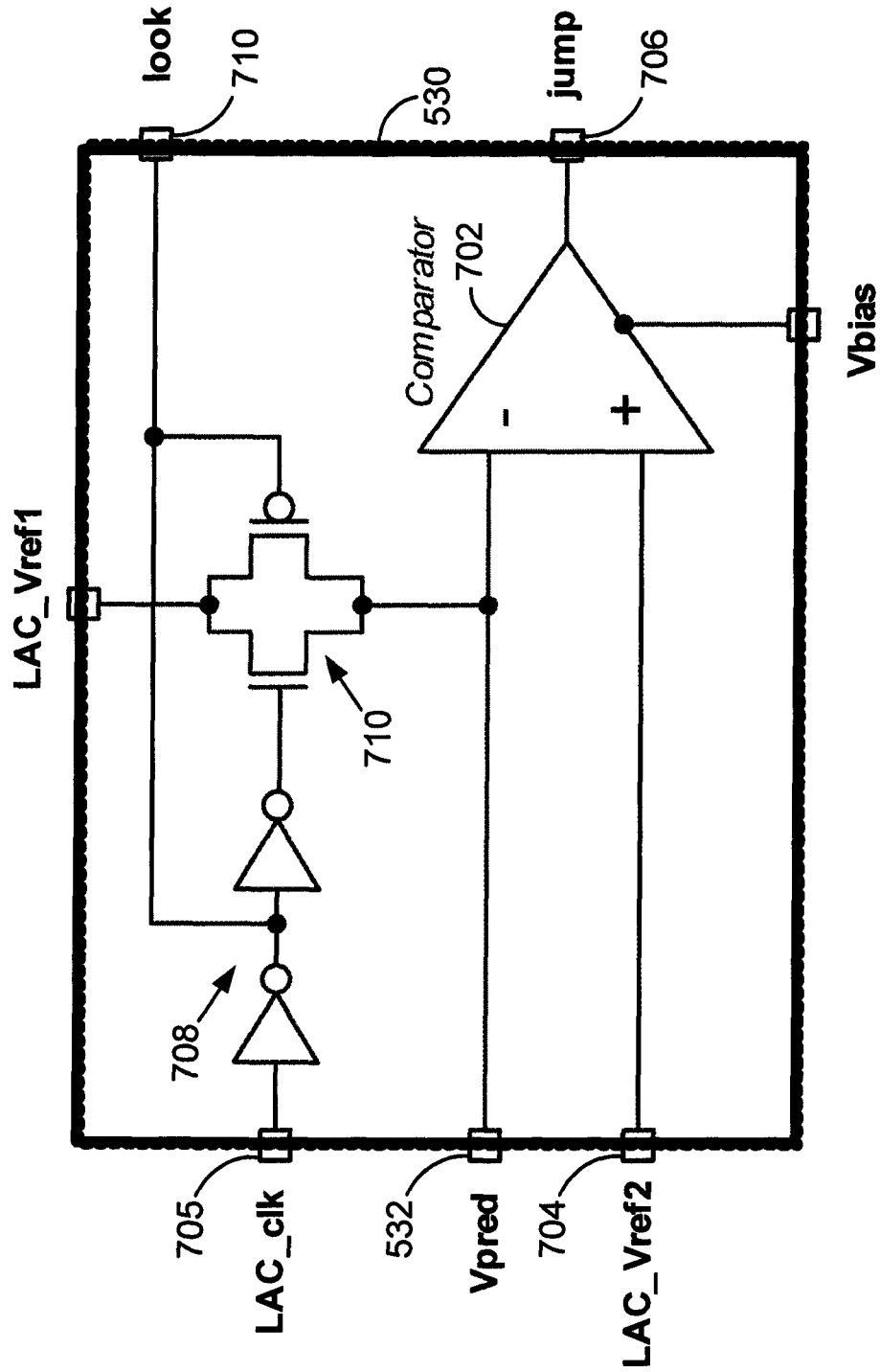
FIG. 7 is a more detailed circuit diagram of the look-ahead controller that can be used in the ADC of FIG. 5.

FIG. 7 shows an embodiment of a look-ahead controller 530 that can be used in the ADC of FIG. 5. The look-ahead controller 530 includes a comparator 702 that has two inputs, one coupled to the Vpred signal line 532 and a second coupled to a threshold reference voltage LAC_Vref2 704. The output of the comparator 702 is coupled to a jump signal line 706. The Vpred signal line 532 is pre-charged to a voltage level of Vref1 by a pair of transistors 710, which are switched on and off using a clock signal LAC_clk on a clock signal line 705. With Vpred charged high, the comparator 702 outputs a low signal level. Once Vpred falls below Vref2 due to enough of the input voltages 502 falling below the Vramp signal, the comparator 702 switches state, generating a jump signal on the jump signal line 706. The LAC_clk signal is used in conjunction with inverters 708 to generate the look signal on look signal line 710. As described further below, the ramp generator is response to the look signal to create the k-step jump. If it is confirmed that any resulting error rate is acceptable, the jump signal is also asserted indicating that the jump is to be maintained. Thus, the look signal generates a step in voltage as a test. An error rate is determined and, if the error rate is acceptable, the stepped-up voltage is maintained. If the error rate is not acceptable, the voltage is returned to its original level.

Figure 8:
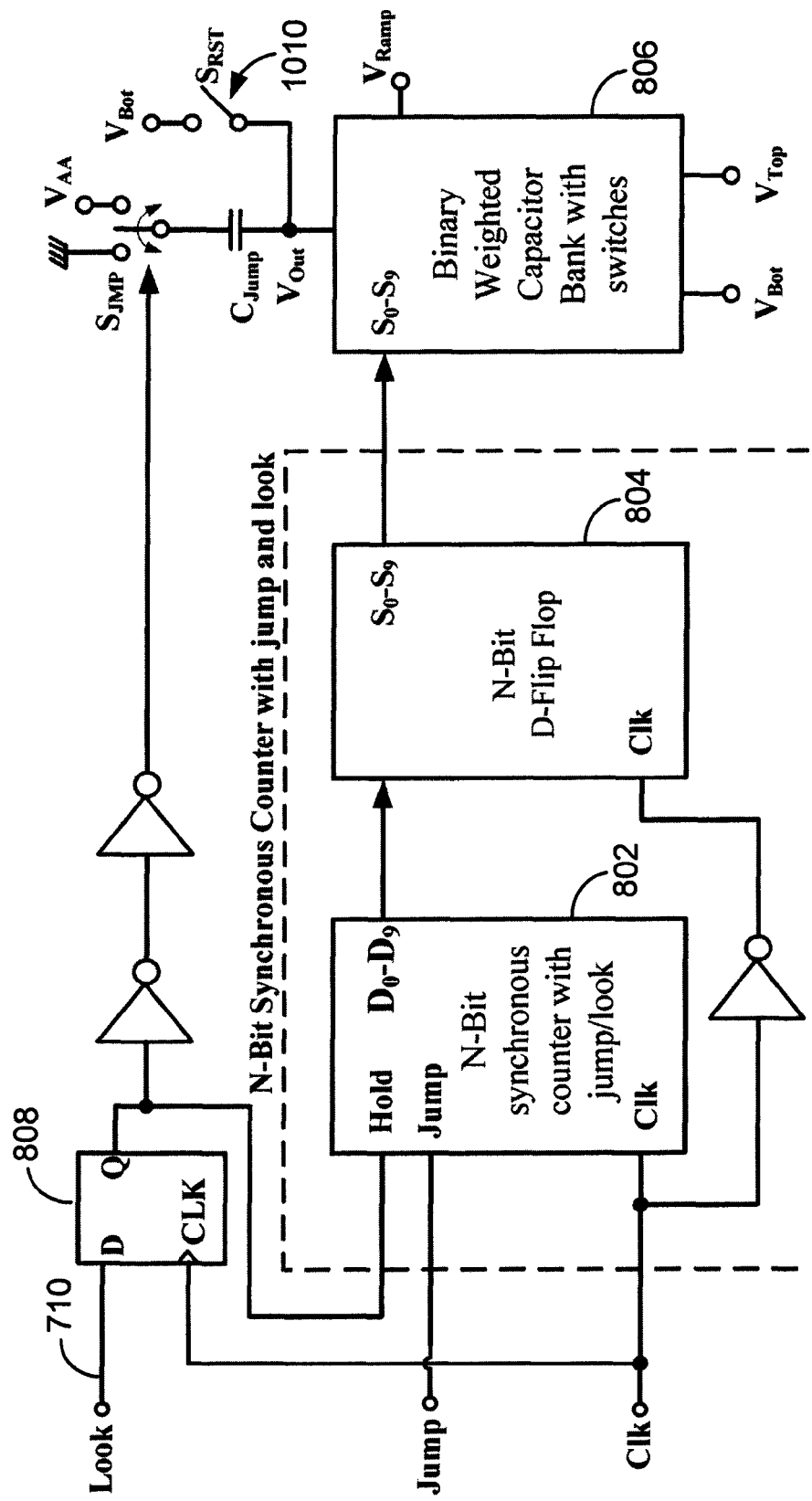
FIG. 8 is a more detailed circuit diagram of a ramp generator with a jump option that can be used in the ADC of FIG. 5.

FIG. 8 shows an example ramp generator 508 that can be used. The ramp generator 508 can include an N-bit synchronous counter 802, an N-bit D-flip flop 804, and a capacitor bank with switches 806 coupled in series. The look signal line 710 is input into a D flip-flop 808, whose output is used as a hold signal for the counter 802. The positive edge D-flip flop 802 synchronizes the look ahead jump or fall back transitions of ramp generator with the clock. The synchronized look signal controls the switch SJMP to pump or dump charge from the node Vout through a capacitor CJump. The switches (S0-S9) 806 can be controlled during negative edge of the master clk. When the look signal is activated or logic-0, the synchronized look signal swaps the switch SJMP to pump charge from VAA to Vout and simultaneously holds the counter 802. Introduced charge pulls up the node Vout to k-steps ahead. During activation of the look signal, if the jump signal changes from logic-1 to 0, the counter is incremented (e.g., by 16-LSB). Upon deactivation of the look signal, the CJump is removed and the k-steps introduced by CJump are compensated by an increment in counter or capacitor bank (e.g., 16-LSB). Until the next activation of the look signal, the ramp generator ramps with discrete steps. While the look signal is activated and jump signal is not changed. Upon deactivation of the look signal SJMP is changed to dump introduced charge or k-step to GND and the ramp signal falls backs k-steps and continues with discrete steps. The value of CJump is chosen such as to compensate the increment in the counter or capacitor bank. The value of CJump can depend on the jump voltage range at Vout during the ramping operation from Vlow to Vhigh.

Figure 10:
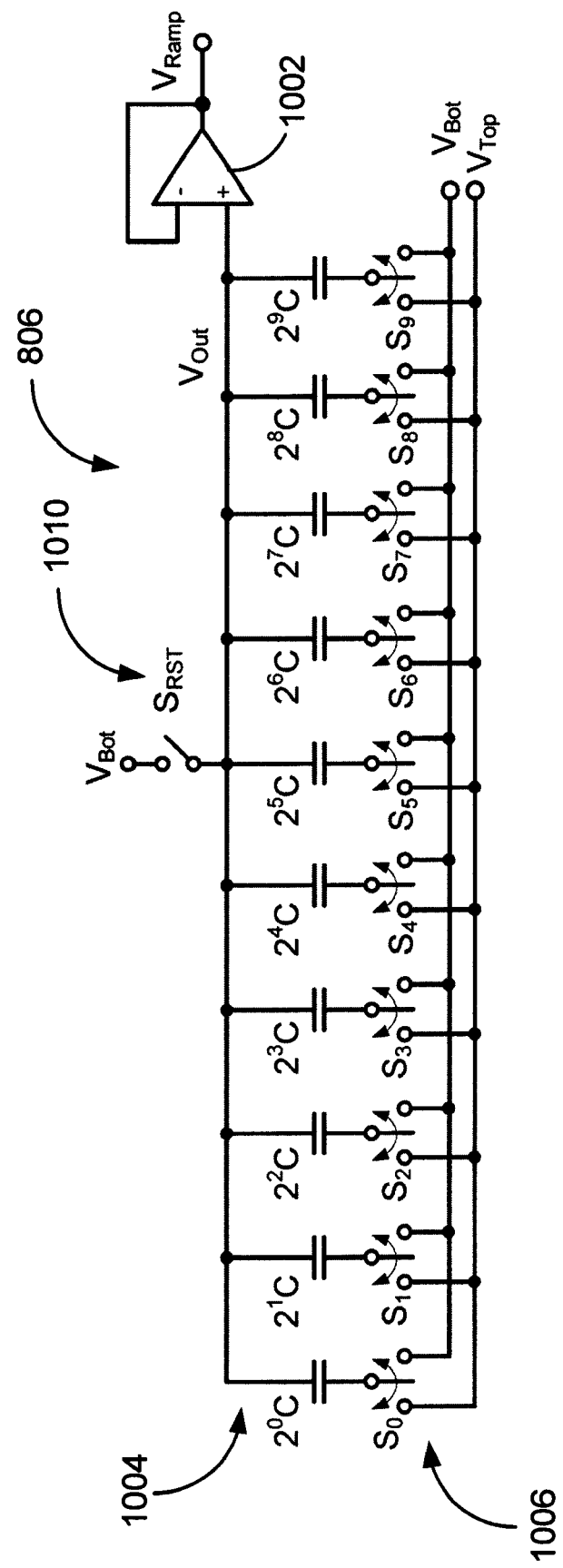
FIG. 10 is a circuit diagram of a capacitor bank that can be used in the ramp generator of FIG. 8.

The illustrated ramp generator is for 10-bit version of a digital-to-analog converter, but other bit widths can be used. Likewise, there are a variety of architectures for ramp generators and the present disclosure illustrates only one possible example, but any known ramp generators can readily be used. Turning briefly to FIG. 10, a particular example of a capacitor bank 806 is shown. The capacitor bank 806 includes an analog buffer 1002, an array of binary weighted capacitors 1004, and switches 1006 (SRST, S0-S9), which connects the capacitor plates to a certain voltage. The switches (S0-S9) are controlled by the 10-bit digital input corresponding to the least significant bit (LSB) to the most significant bit (MSB). Depending on the switch condition, the bottom plate of capacitor is either connected to VBot or VTop voltage level (which correspond to Vlow and Vhigh).

When switch SRST 1010 is closed, the set of top plates of the binary capacitances are coupled to VBot. When the digital input equals to a logic low, the bottom plate of the capacitors are connected to VBot so that the top and bottom plate of the capacitor are at same potential and the net charge on any capacitor will be zero. When 10-bit digital inputs are incremented, there will be a charge distribution between the two sets of capacitors: CTop and CBot. CTop is the total capacitance between node Vout and VTop node. Similarly, CBot is the equivalent capacitance between node Vout and VBot. This charge distribution results a voltage change on output node as given by equation:

$$V_{out} = \frac{(V_{Top} - V_{Bot})}{\sum_{i=0}^{n-1} C_i} C_{Top} + V_{Bot} = V_{Step} \cdot C_{Top} + V_{Bot}$$

Voltage on node Vout can be increased in discrete steps (VStep) such as if the digital inputs are increased by 1-LSB at regular time intervals. In order to control the switches or to generate n-bit digital input at regular intervals, the n-bit synchronous counter 802 can be used. The reason for using the synchronous counter 802 is that whenever capacitors are switching between VBot and VTop it involves charge pumping to or from the node Vout. If switching does not take place simultaneously, the output node could have a glitch during the counter increment.

Figure 9:
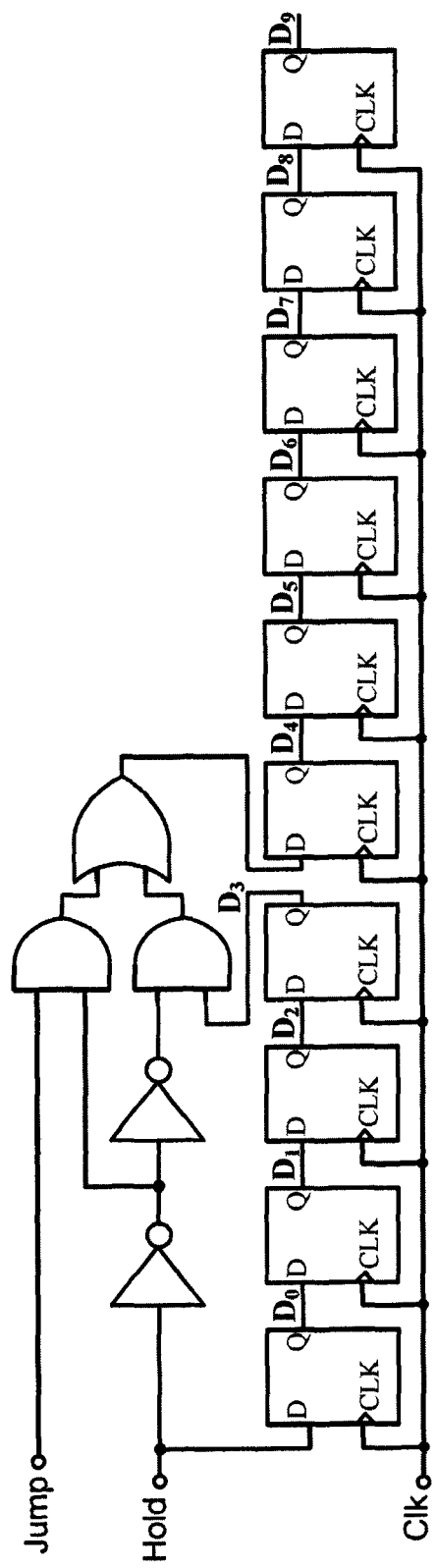
FIG. 9 is a more detailed circuit diagram of a counter with the ability to jump ahead that can be used in the ramp generator of FIG. 8.
Figure 12:
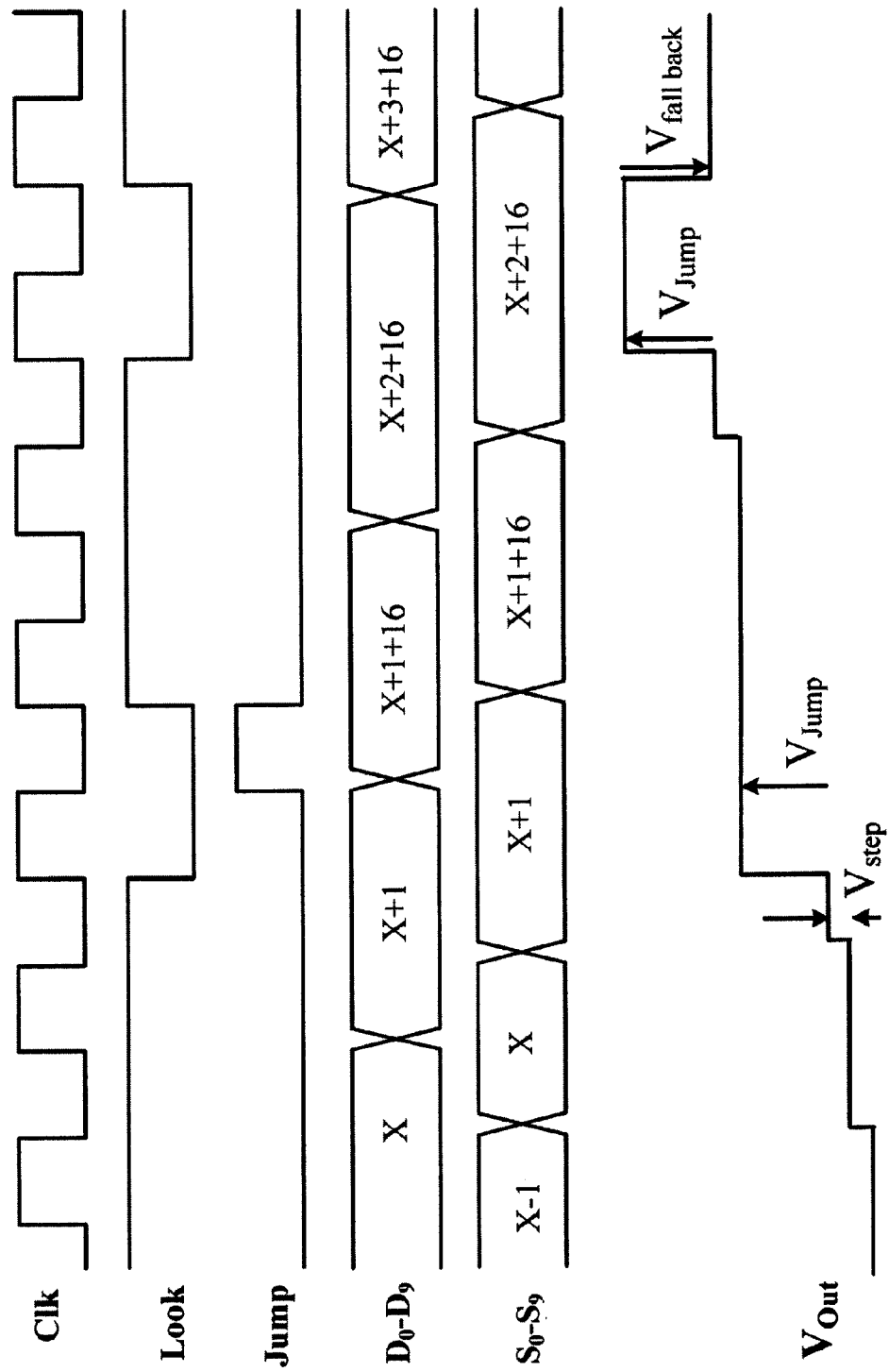
FIG. 12 is a timing diagram that can be used with the ramp generator of FIG. 9.

FIG. 12 shows timing diagrams for the example ramp generator of FIG. 8. As can be seen, the substantially ramped output can be a series of steps (Vsteps) and a jump is more than 1 Vstep. The above explained 10-bit ADC topology can be modified to attain 10-bit ramp signal with look and jump features for SSLAR ADC. There are different ways to achieve the required function. In order to jump and fall back as quick as possible, an additional capacitor CJump can be included. The value of CJump depends on jump voltage range at the Vout during ramping operation from VBot to VTop. To implement the counter, an additional combinational logical circuit can be added to a 10-bit synchronous counter, such as is shown in FIG. 9. There are two signals to control the look and jump function in 10-bit ramp block. Depending on the jump control input, the combination logic introduced in the 10-bit counter adds binary weighted numbers to the present value of the 10-bit counter value. For example, when jump equals to 0, it does not affect the normal operation of the counter. When jump asserted to 1, the combinational logic at the output 4th bit adds 16 to the previous state value. As long as jump is asserted, the counter is incremented by 16 during each positive edge of the clock. When hold equals '0', the counter holds four LSB bits and holding or jumping the 16 LSB depends on the jump signal. Although a reset signal is not shown in FIG. 9, one skilled in the art can easily add a reset line that will initiate the counter to zero. Additionally, a similar type counter can be used as the counter 540. It will be recognized that any desired counter design can be used, as it is well within one skilled in the art to use any of a variety of counter designs as the counter 540.

Figure 11B:
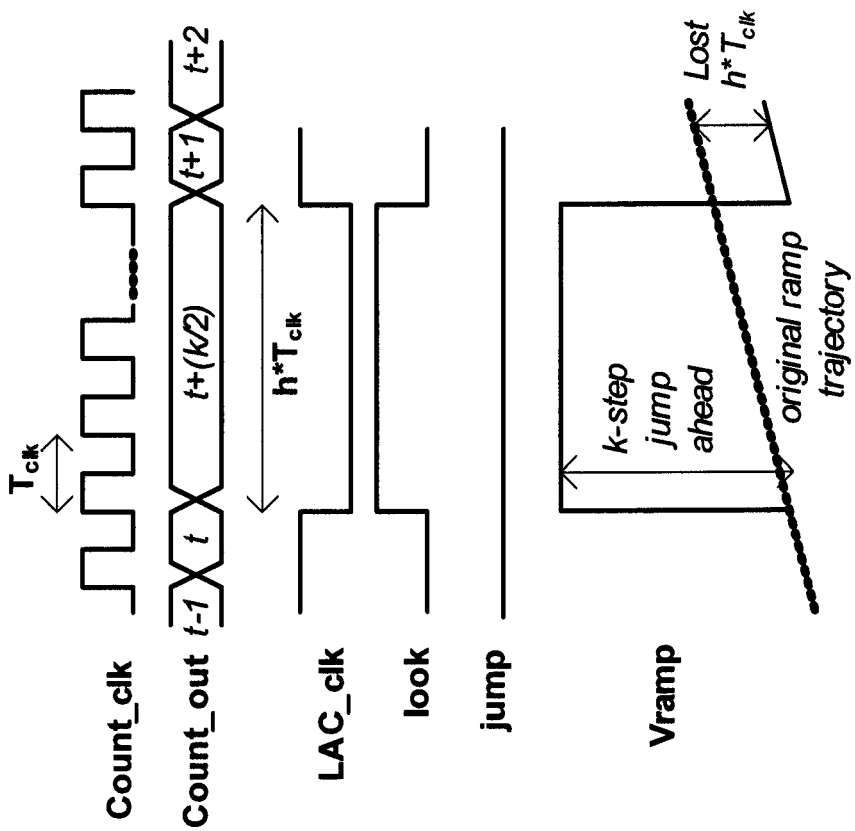
FIGS. 11A and 11B are timing diagrams of the ADC of FIG. 5 with a jump ahead and jump back, respectively.
Figure 11A:
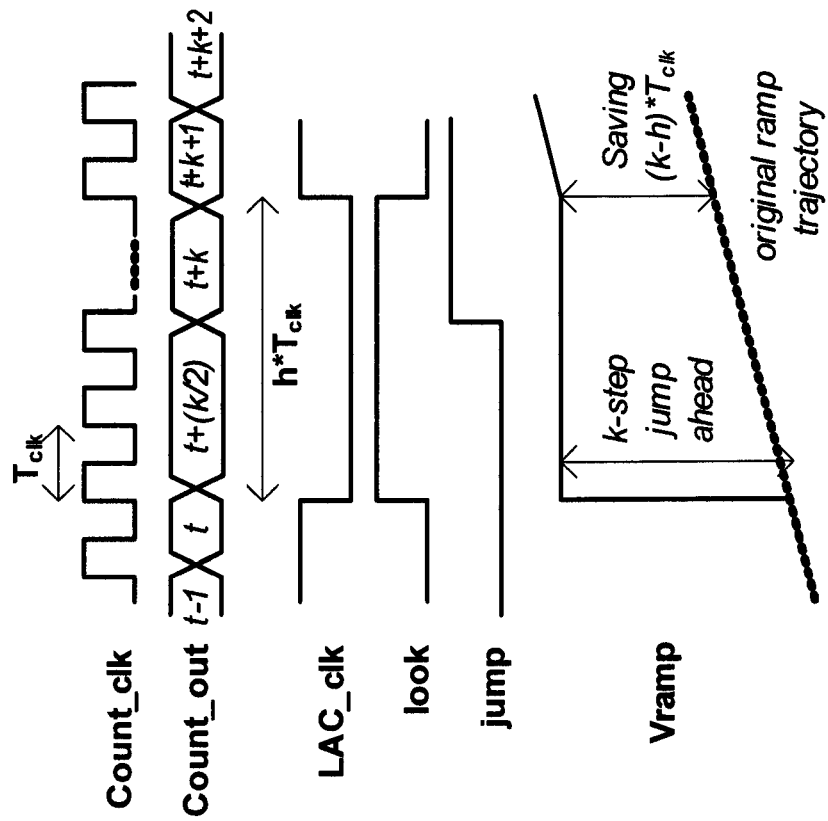

FIGS. 11A and 11B show timing diagrams for the ADC with a look-ahead controller. The ramp generator 508 can receive two digital control signals from the LAC block: look and jump. When the look signal is activated, the ramp output (Vramp) jumps k-steps ahead while counter jumps (k/2)-bits ahead. The k/2 value is chosen for the counter as an average digital value should there not be a jump back. Other values can be chosen. If the jump signal is a logic-1 while the look signal goes from logic-1 to logic-0, then the ramp output continues from jumped analog ramp level. In this case, counter jumps (k/2) bits more to count from k-bits ahead from the pre jump count value (t) (see FIG. 11A). If jump signal is logic-0 while look signal going from logic-1 to logic-0, then the ramp output falls back k-steps to the original level before look operation. In this case, counter also jumps (k/2) bits back to count from the pre jump count value (t) as seen in FIG. 11B.

In the case where all column voltage values (Vin[1-m] ~Vx) are in one k-step range of the ADC input, conversion time of an n-bit SSLAR ADC is given by the following equation:

$$T_{con,SSLAR,best} = \left(\left(\frac{2^N}{k}\right) \cdot h + k\right) \times T_{clk}$$

In the case where column voltages exist in all gray levels of the ADC range, conversion time of n-bit SSLAR ADC is given by the following equation:

$$T_{con,SSLAR,worst} = \left(\frac{2^n}{k}\right) \cdot (h+k) \times T_{clk}$$

Conversion time of standard single slope ramp (SSR) ADC is independent from and condition and is given with the following equation:

$$T_{con,SSR} = 2^n \times T_{clk}$$

Thus analog-to-digital conversion speed-up (Sup) and slow-down (Sdown) ratios for n-bit resolution can be found in for best and worst cases with the following equations:

$$S_{up} = \frac{T_{con,SSR}}{T_{con,SSLAR,best}} = \frac{2^n}{\left(\frac{2^n}{k}\right) \cdot (h+k)}$$

$$S_{down} = \frac{T_{con,SSR}}{T_{con,SSLAR,worst}} = \frac{2^n}{\left(\frac{2^n}{k}\right) \cdot (h+k)}$$

If it is assumed that half of the columns are within the k-step range and the other half not, then the speed-up ratio could follow the following equation:

$$T_{con,SSLAR,nom} + \left(\left(\frac{2^{n-1}}{k}\right) \cdot (h+k)\right) \times T_{clk}$$

$$S_{up} = \frac{T_{con,SSR}}{T_{con,SSLAR,nom}} = \frac{2 \cdot k}{(h+k)}$$

Thus proposed SSLAR-ADC architecture provides 78% (or 1.78 times) analog to digital speed improvement in nominal case for k=16, n=10, and h=2 over the standard SSR ADC architecture. This improvement becomes 7.11 times in best case scenario for the same n, k, and h values.

Figure 13:
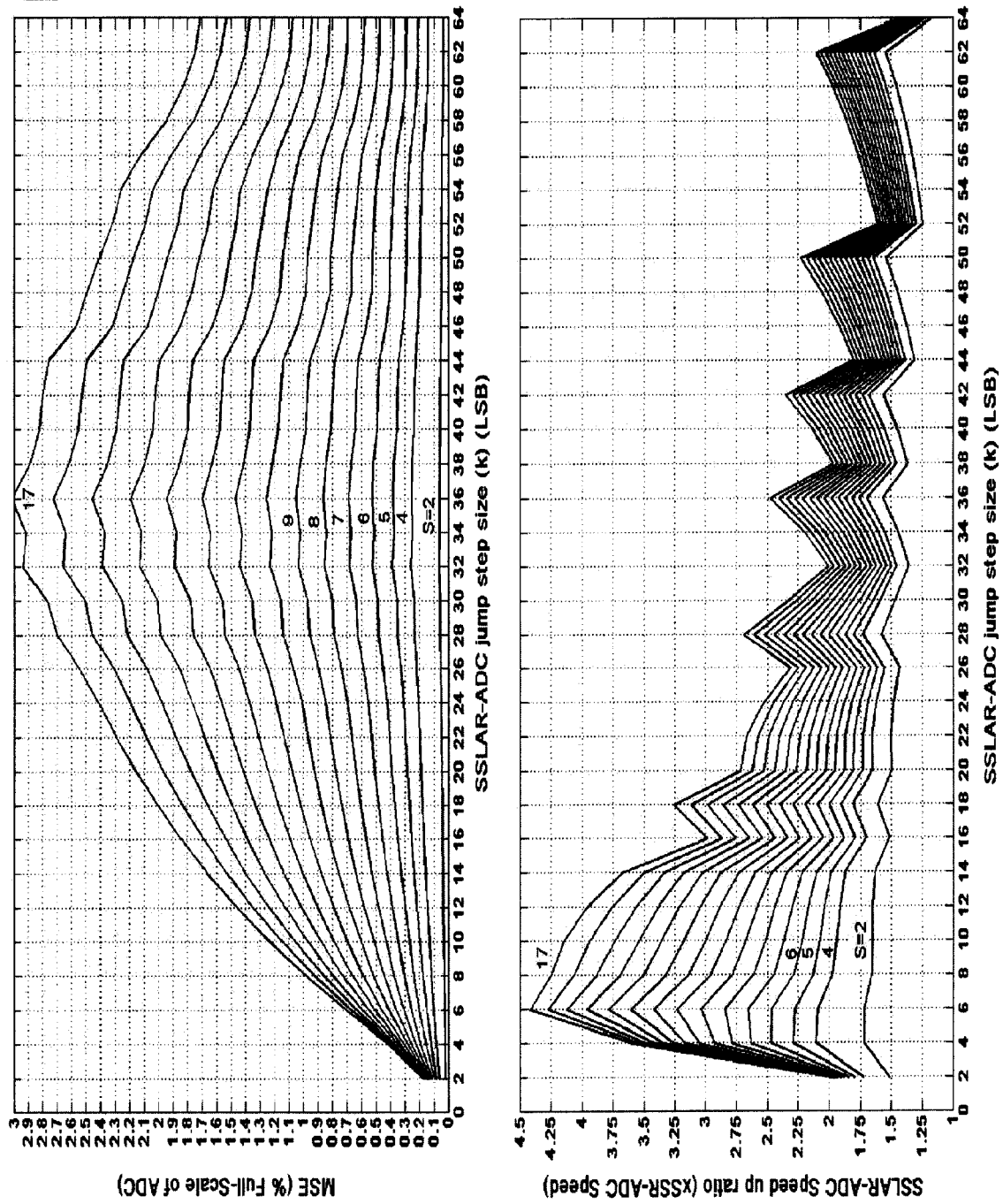
FIG. 13 shows different graphical representations of mean-square errors and speed-up ratios depending on the jump size and threshold values used for jumping.

FIG. 13 includes two graphs showing Mean Square Error (MSE) versus the jump step size for varying threshold levels (S) and speed-up ratio versus the jump step size. As expected, larger threshold introduces greater error, but faster speed-up. As can be seen, step sizes between 2 and 64 were tested with increments by 2. Additionally, the thresholds varied between 2 and 17. Other step sizes and thresholds can be used.

Figure 14:
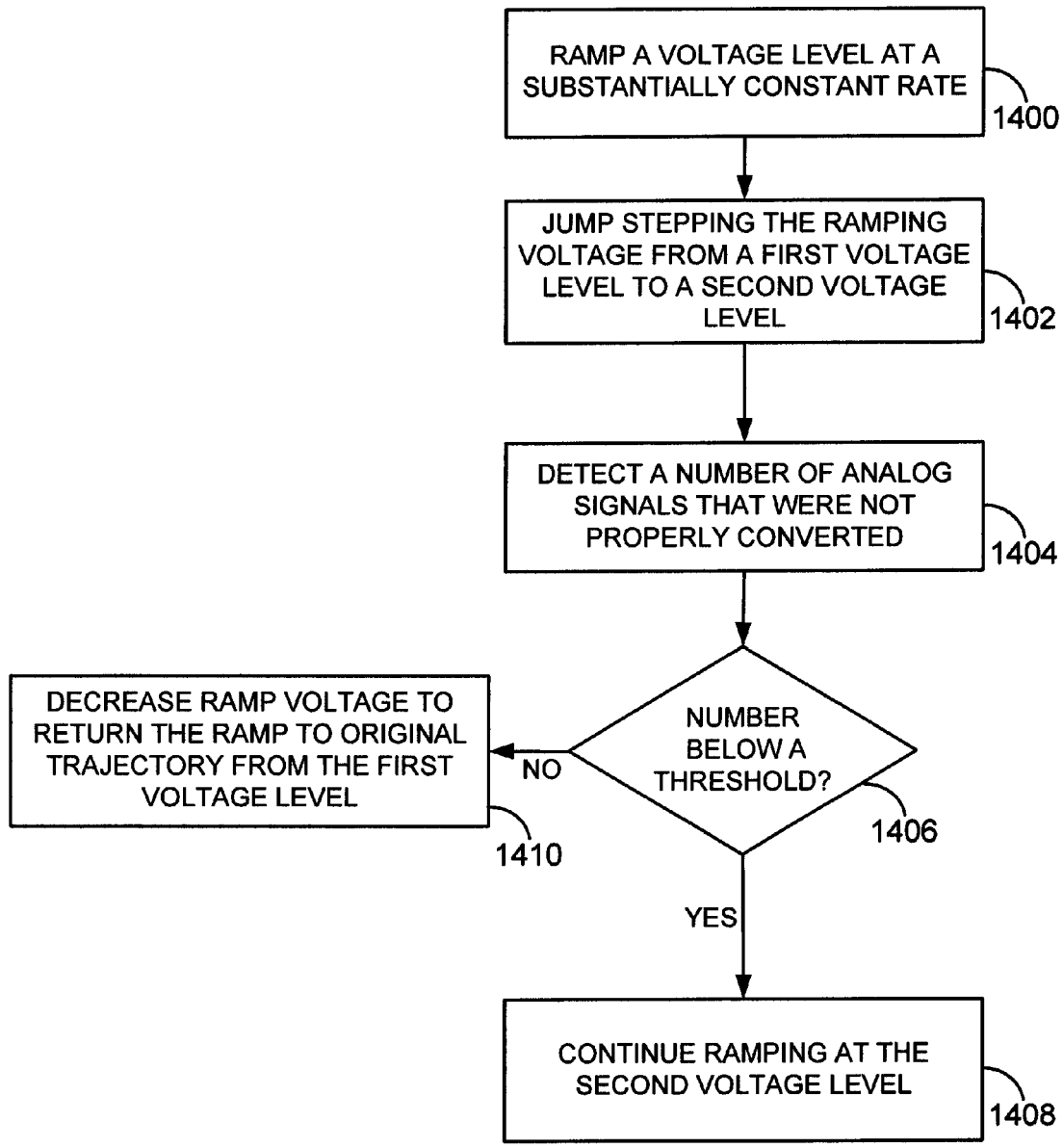
FIG. 14 is a flowchart of a method for jumping that can be used in the ADC of FIG. 5.

FIG. 14 is a flowchart of a method for converting analog to digital. In process block 1400, a voltage is ramped at a substantially constant rate. A substantially constant rate can be with discrete steps, as illustrated in FIG. 12 or with a continuous slope, as illustrated in FIG. 11. In process block 1402, a look-ahead jump step is performed so that the voltage jump steps more than at the constant rate. For example, if the substantially constant rate has a discrete step of 1 unit, then the jump is a k-step increment, where k is greater than 1. The example jump is between a first voltage level and a second voltage level. In process block 1404, a detection is made of the number of analog signals that were not properly converted to digital. Thus, as a result of the jump step, a number of the comparators 504 immediately switch states locking the count k/2 in the latches 550. In this way, the look-ahead controller dynamically tests voltage levels on the comparator outputs to determine if the error rates would exceed a desired number. The predictor circuits 520 can sense the number of comparators that changed state through detection of the voltage levels on the comparators and supply such information to the look-ahead controller 530. In decision block 1406, if the number detected is below a threshold then in process block 1408, the ramp is maintained at the substantially constant rate from the second voltage level. If the number detected is above a threshold number, then too many pixels are affected by the jump step and the ramp voltage is decreased back to the first voltage level (process block 1410) so that it can continue along at its original trajectory (e.g., 1 step at a time).

Figure 15:
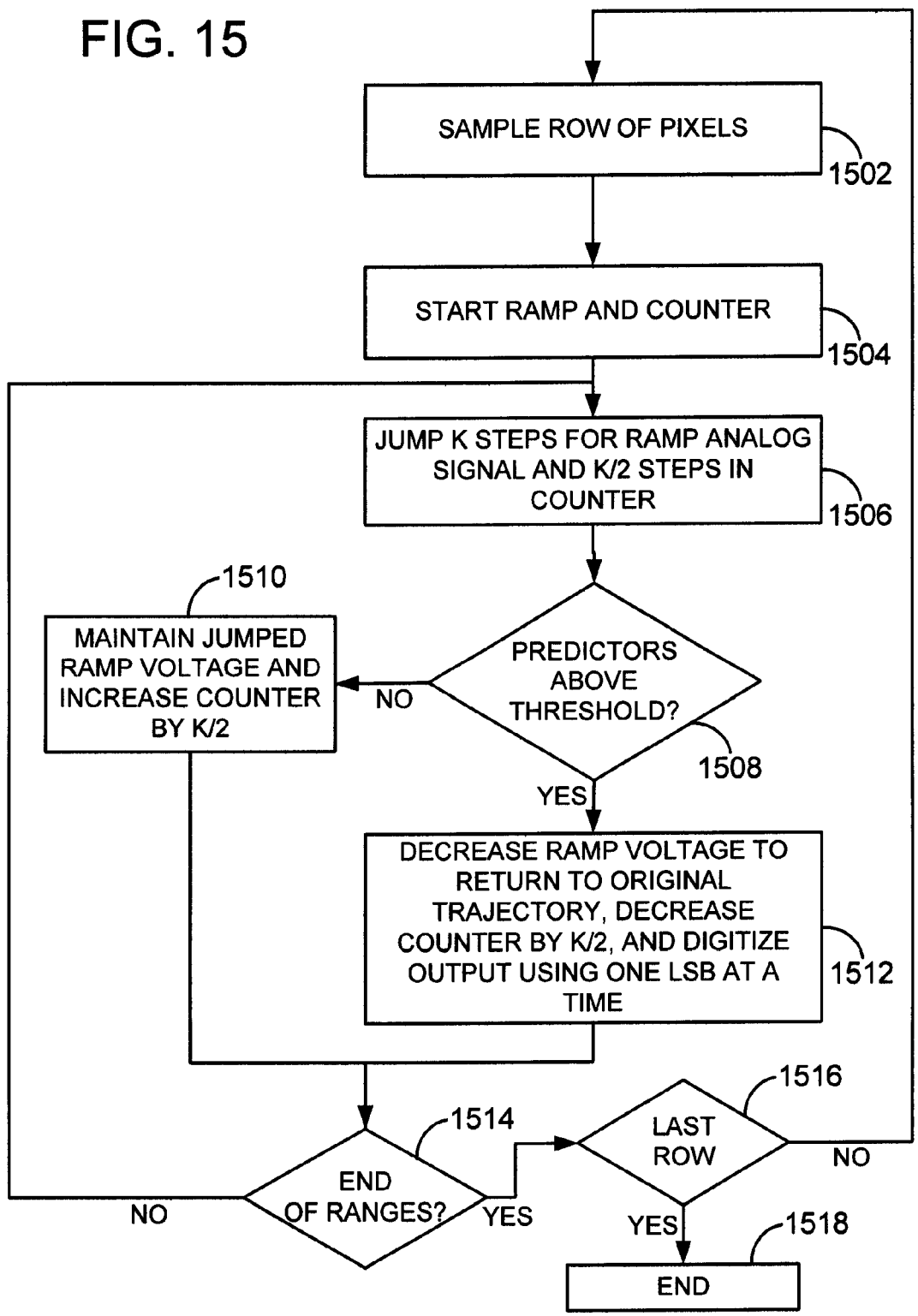
FIG. 15 is a flowchart of a method providing additional details that can be used in the flowchart of FIG. 14.

FIG. 15 is a flowchart of a method showing additional details to the flowchart of FIG. 14. In process block 1502 a row of pixels is sampled in a pixel array, such as in a CMOS image sensor. In process block 1504, a ramp generator and counter are reset and started. In process block 1506, the ramp generator has a k-step jump and the counter is incremented k/2. Thus, instead of a typical ramp of one step, the k-step jump is more typically a jump of 2 or more steps (typical example steps are 5, 6, 7 . . . 15). In decision block 1508, a check is made to determine if the predictor circuits are above a threshold number. If not, the k-step jump is maintained and the ramped voltage continues from the jumped to location (process block 1510). Additionally, the counter is incremented an additional k/2 steps to synchronize it with the ramp generator. If decision block 1508 is answered in the positive, then the ramp voltage is decreased by k steps back to its original value and trajectory (process block 1512). Additionally, the counter is decremented by k/2 to synchronize it with the ramp generator. At decision block 1514, a check is made to determine if all of the ranges have been completed. If not, then the process loops back to process block 1506 and continues. If process block 1514 is answered in the positive, then a check is made in decision block 1516 whether this is the last row in a frame to convert into digital. For example, there may be additional row of pixels to convert. If yes, then the process ends (process block 1518), but, if not, then the process starts over again at process block 1502.

Programmable Ramp Generator Design for SSLAR ADC

Figure 16:
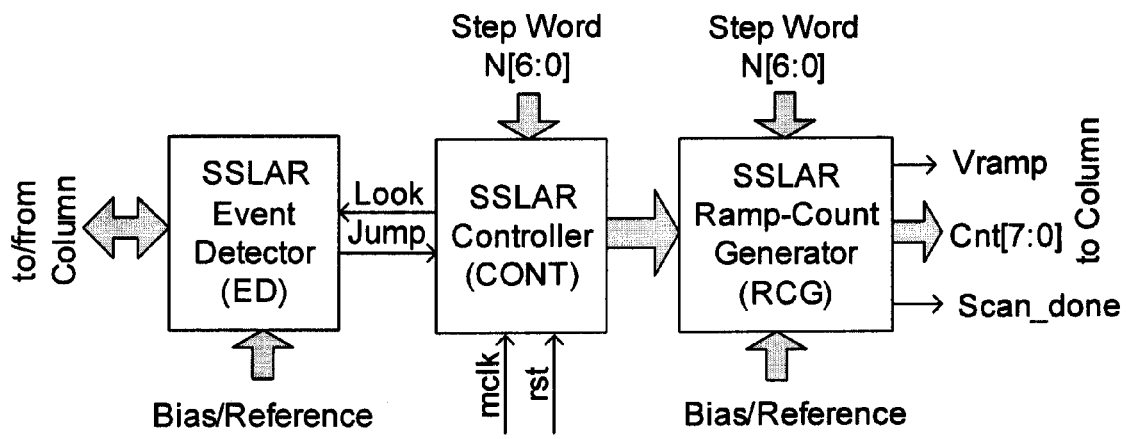
FIG. 16 is an embodiment of a step programmable SSLAR block.

Global section of the step size programmable SSLAR (single slope look ahead reamp) ADC composes of three units; controller (CONT), event detector (ED) and ramp-count generator (RCG) as shown in the FIG. 16 (column section of the SSLAR ADC is not shown). The 8-bit-SSLAR ADC was designed and can be further expanded. 7-bit look-ahead step size word (N[6:0]) is entered to both the controller and ramp-count generator blocks. Thus, look-ahead step size can be programmable between, for example, 0 and 127 LSB.

The event detector (ED) is connected to column predictor circuits and generates the "Jump" signal depending on the "Look" signal from the SSLAR controller, and column predictor conditions. ED also receives analog bias and reference voltages for proper operation.

The controller unit (CONT) generates the look-ahead signal ("Look") for the event detector and other control signal for SSLAR ramp-count generator (RCG). It is the part of the SSLAR ADC implementing the conversion algorithm.

The ramp-count generator (RCG) generates three output signal; ramp voltage (Vramp), code scan done pulse (Scan_done), and 8-bit counter output pulses (Cnt[7:0]). Ramp and counter pulses are connected to the column section of the SSLAR ADC topology. RCG receives the control signals from the CONT, look-ahead step program word, and the analog voltage reference and bias signals.

SSLAR ADC Controller (CONT) Unit Design

Figure 17:
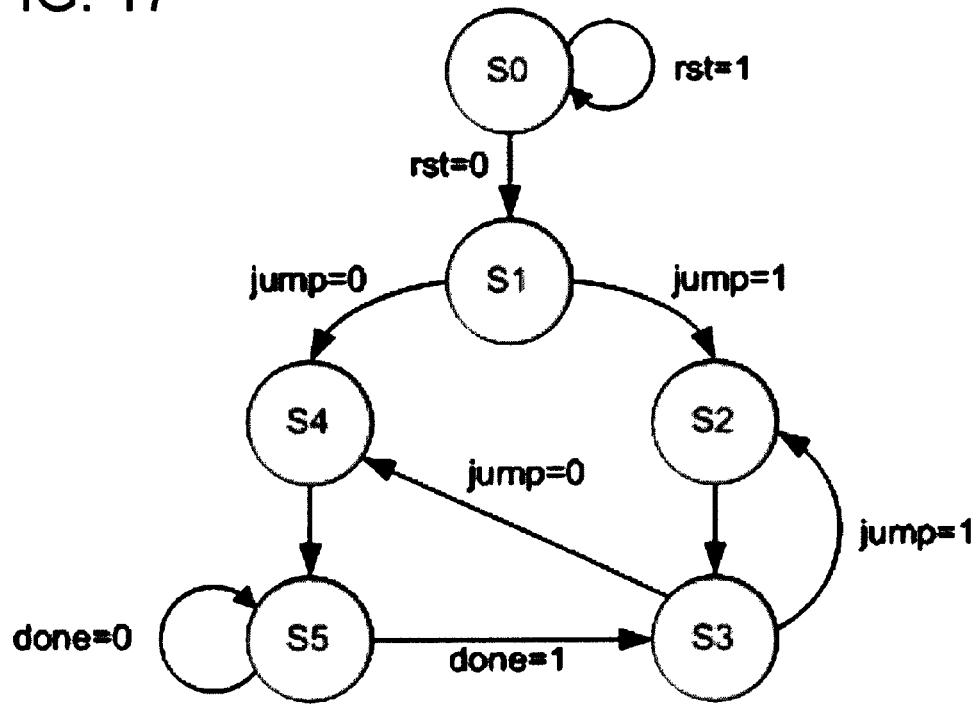
FIG. 17 is an embodiment of a state machine for a controller unit.

SSLAR ADC Controller unit is the central part of the SSLAR ADC. It generates unique control signals to ED and RCG units implementing the SSLAR ADC algorithm. A finite state machine (FSM) can be used for generating the control pulses as shown in FIG. 17. It has six (6) operation states to generate six (6) different control signals (listed in Table 1). Some of the signal are used directly by the ED and RCG units (Look, Cnt[2:0]), while some of them are used internally to generate other control signals.

Figure 18:
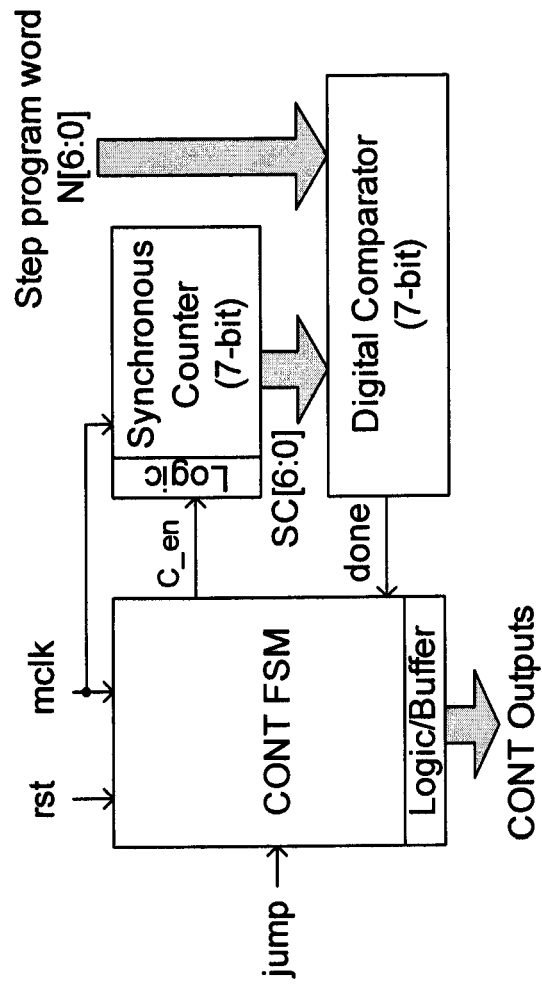
FIG. 18 is a block diagram of the SSLAR controller unit.

Four control signals determine the finite state machine's (FSM) states: operation reset ("rst"), jump signal from event detector ("jump"), internal counter done signal ("done"), and master clock signal ("mclk"). If the rst=1, state machine stays at S0 state. FSM changes its state at rising edge of the master clock signal conditionally or unconditionally. Unconditional state changes only exist from states S4 to S5 and from S2 to S3. Other state transitions depend on value of the jump, done and reset signals. If the reset is set high, the state machine goes to state S0 and waits until the reset signal is cleared to move to state S1. Done signal is generated in the CONT unit by a 7-bit synchronous counter and comparator units, as shown in the Block diagram of the SSLAR ADC controller unit (CONT) (FIG. 18). It composes of CONT FSM, 7-bit synchronous counter, and 7-bit digital comparator. Operation of the counter/comparator combination is enabled by the FSM through counter enable signal (C_en). If C_en=1 then the counter start counting while comparator checking weather counter value (SC[6:0]) is equal to the step program word (N[6:0]). If it is equal, it asserts the done signal to high for FSM to take action. If the done signal is asserted high, then the counter enable signal is de-asserted (C_en=0), and changes the state from S5 to S3. When C_en=0, synchronous counter is reset to "0000000", it waits for C_en to be asserted high again. Logic attached to the counter is used for gating and delaying certain signals for proper operation.

Figure 19:
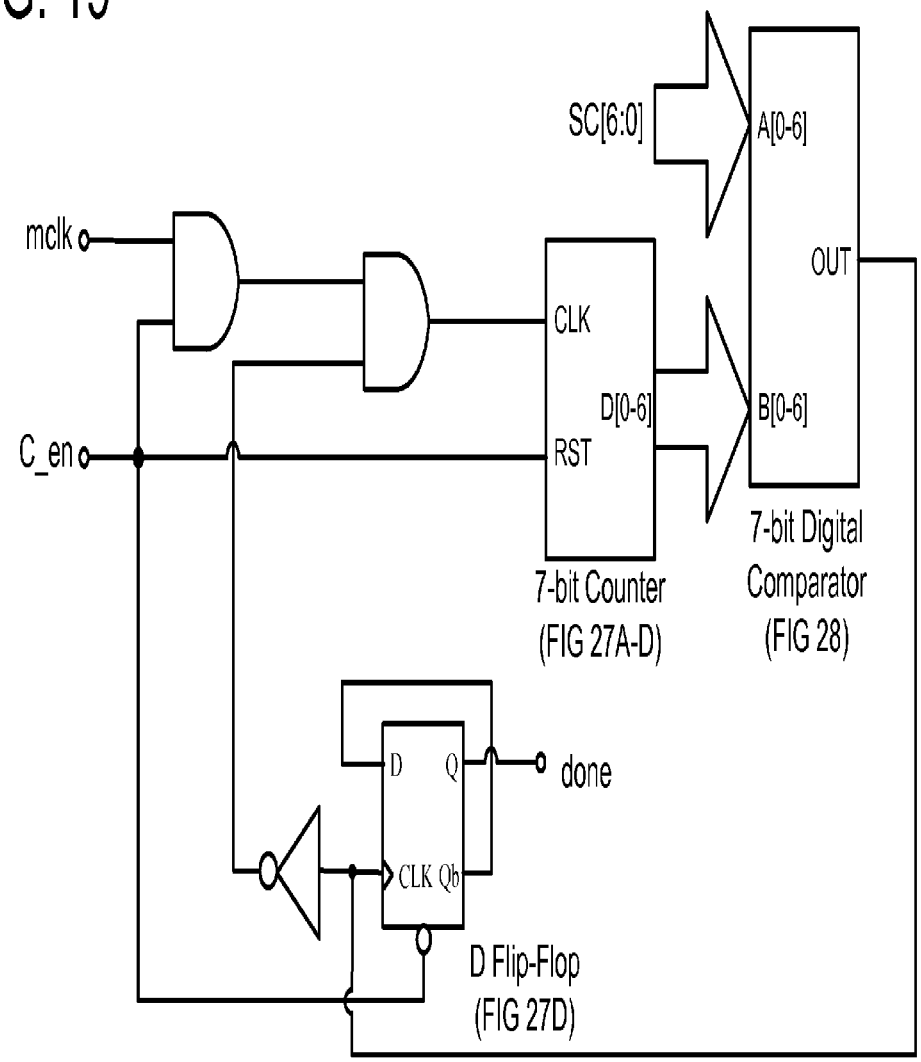
FIG. 19 is a circuit diagram of a counter/comparator/logic block in the control unit.

An embodiment of a detailed circuit diagram of the counter, comparator and counter logic is shown in FIG. 19. Circuit elements labeled HS1 is the 7-bit synchronous counter, while the HS3 is the 7-bit digital comparator. HS2, and HS4-12 constitutes the counter logic.

Figure 20:
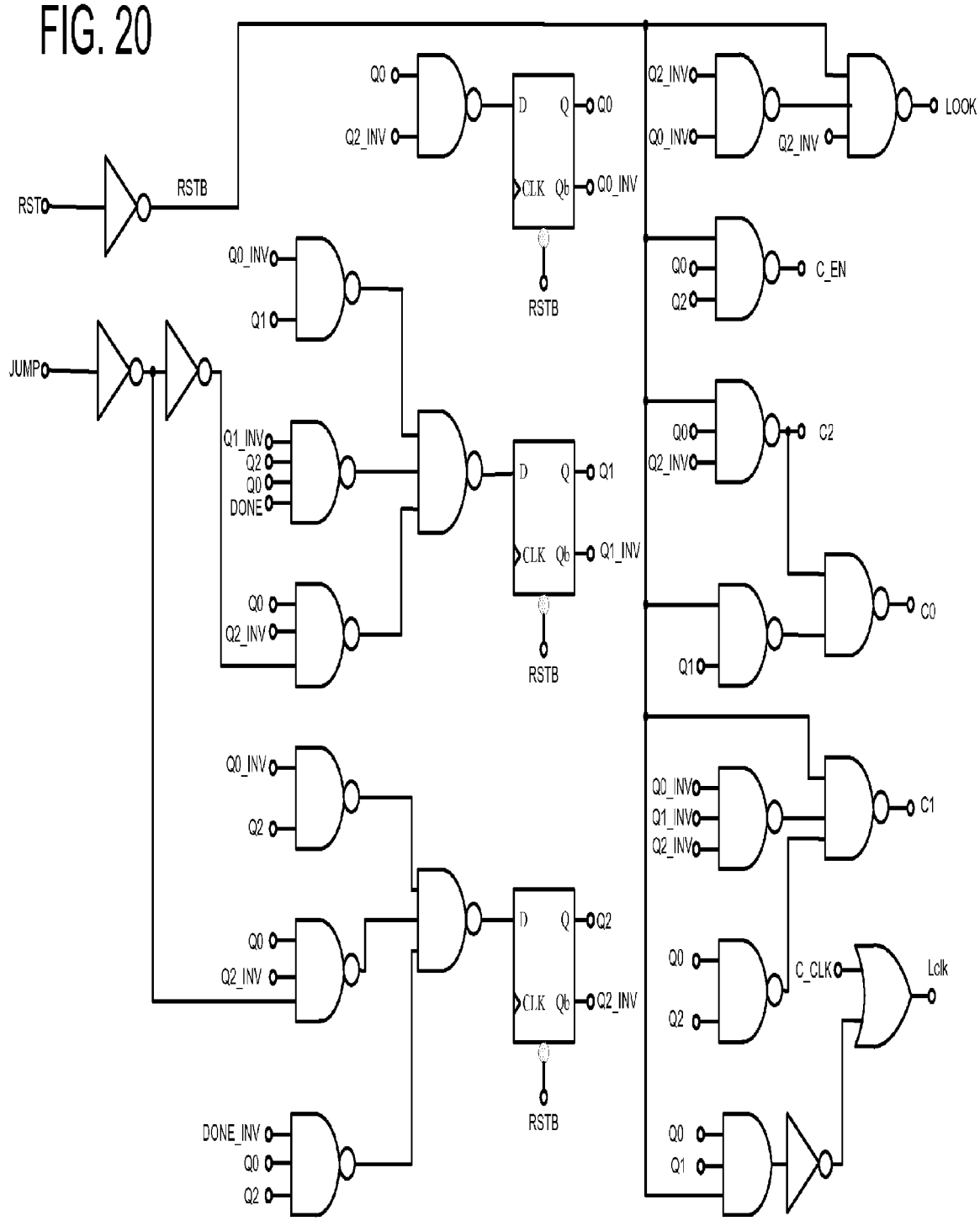
FIG. 20 is a circuit diagram of a synthesized control unit FSM and logic/buffer elements.

Controller FSM is synthesized based on the state diagram in FIG. 17. Circuit implementation of the synthesized CONT FSM and the logic/buffer blocks are shown in FIG. 20. Circuit elements U1-U25 are the logic and buffer elements, while HS1-HS12 implements the synthesized state machine. D-type flip-flops used in the FSM are raising edge triggered.

SSLAR Ramp-Counter Generator (RCG) Design

Figure 21:
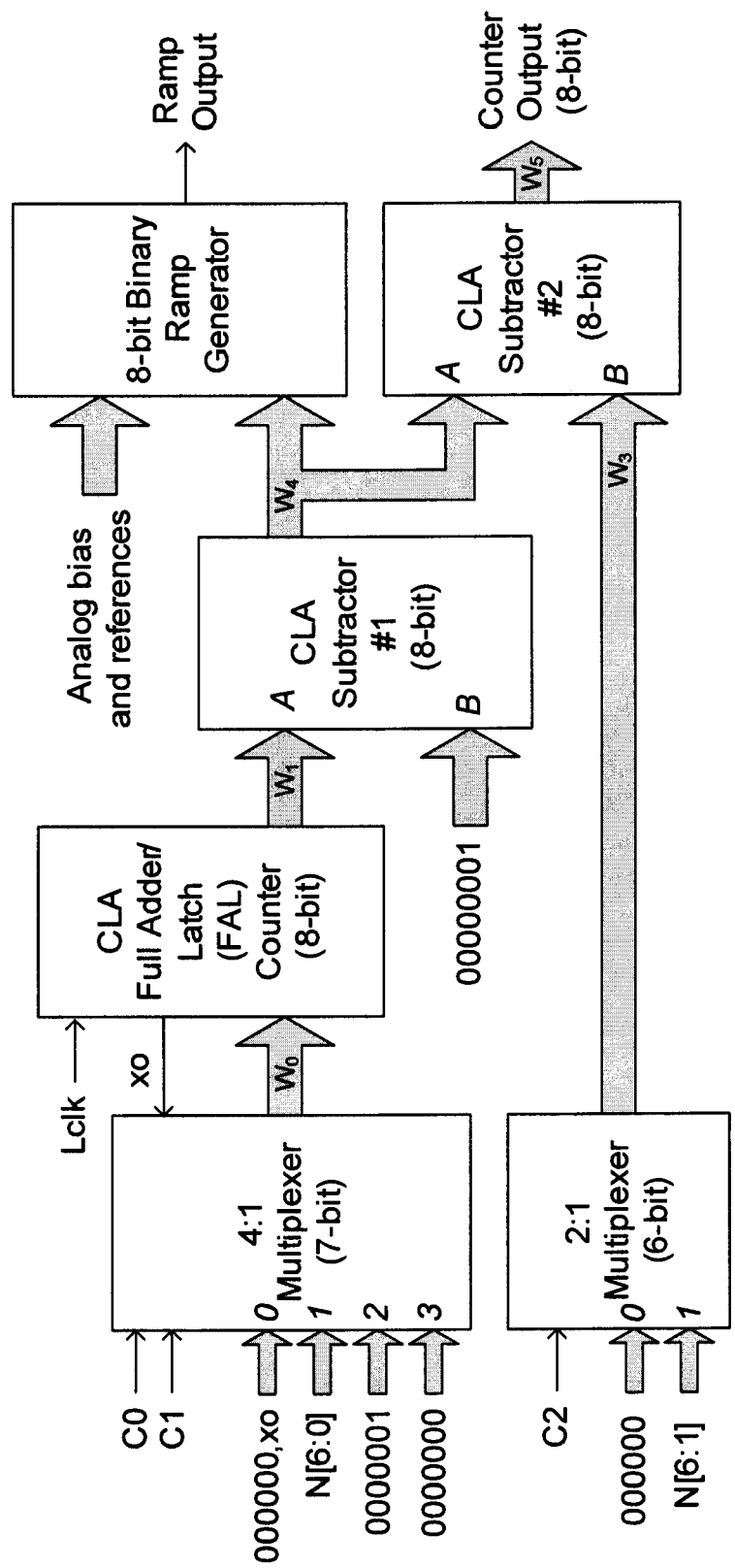
FIG. 21 is a block diagram of a ramp-count generator.

Block diagram of the ramp-count generator unit is shown in FIG. 21. It generates the analog ramp signal and the associated 8-bit digital counter words. The unit includes two multiplexers, one continuous time digital carry-look ahead (CLA) full-adder and latch (FAL) block, two continuous time carry-look ahead digital subtractors and one 8-bit binary weighted charge scaling ramp generator blocks. Look ahead, jump and fall back operations are controlled through the proper timing of the blocks without having physical counter units in the RCG unit. Only clocked unit is the CLA-FAL unit which allow programmable look-ahead, jump or fall back operations.

Figure 22:
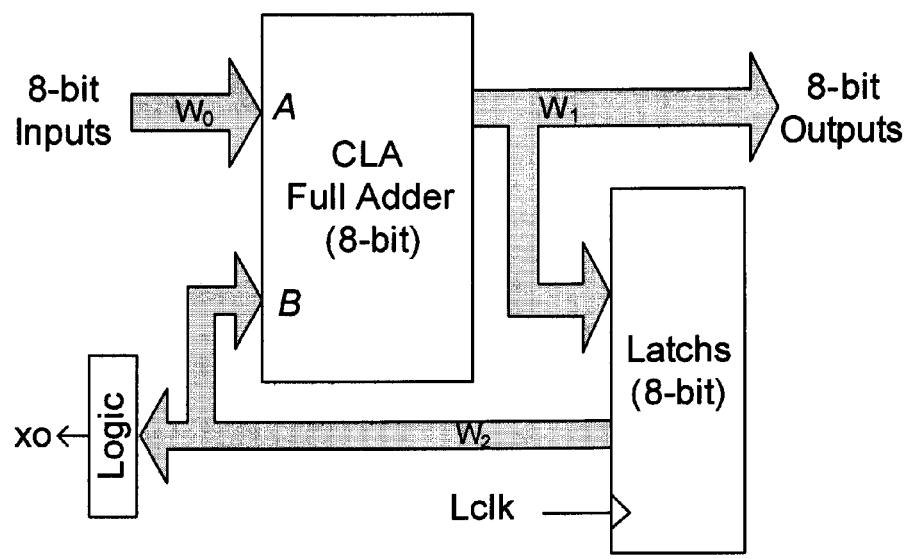
FIG. 22 is a block diagram of a carry-look ahead full-adder and latch unit.

A block diagram CLA full-adder and latch (CLA-FAL) unit is shown in the FIG. 22. It is a part of look-ahead and jump operation. Latch clock (Lclk) is generated and feed to the unit from the CONT unit. 8-bit inputs (A[7:0]) to CLA full-adder are provided by the 4:1 multiplexer unit. Other inputs (B[7:0]) come from the 8-bit latch outputs. CLA full adder adds these two inputs and generates the CLA-FAL block outputs. Output of the CLA full-adder block is also feed to the 8-bit latch unit. Rising edge triggered D-type flip-flops are used in the latch unit. When Lclk signal is asserted from low to high, latch block holds the 8-bit outputs of the CLA-FAL unit.

Depending on the state of the FSM in CONT unit, one of the four words are passed to CLA-FAL unit from 4-to-1 multiplexer. Multiplexer selection codes (C0, C1) are generated by the controller unit based on the state of the FSM. When C0='0' and C1='0', digital word equal to zero (0) is passed if xo='0', and one if xo='1'. If the C0='1' and C1='0', then the 7-bit step programming word (N[6:0]) is passed. Digital word equal to one (1) is passed when the selection code equals to C0='0' and C1='1'. Multiplexer input for C0='1' and C1='1' was set to zero (0). As a result, in combination with the 4-to-1 multiplexer outputs, and Lclk signal, CLA-FAL unit either stops counting for C0='0' and C1='0' or add '1' if xo='1', or counts n-by-n (N[6:0]=n, i.e. n=5 if N[6:0]="0000101") for C0='1' and C1='0', or counts 1-by-1 for C0='0' and C1='1'. Logic block in the CLA-FAL unit generates a signal for the CONT unit for appropriate timing. It composes of an 8 input NOR gate to generate "xo" signal.

The CLA type full adder was used due to the fact that other digital adders, such as the ripple carry adders, produce non ideal transition of the output values. In ripple carry adder, adder output for the LSB bit comes first, while the MSB bit becomes available later after certain delay time. This nonlinear delay between adder output bits cause glitches in binary ramp generator (BRG) block. It is because both adder and the binary ramp generator work in continuous time domain. Any delay among adder outputs is reflected at the output of the ramp generator.

Carry-look ahead subtractor #1 block subtracts "00000001" from the CLA-FAL block outputs (W1). This allows digital bits used by BRG to be between 0 and 255 for 8-bit. This is due to the fact that CLA-FAL generated counting values are between 1 and 256.

2-to-1 multiplexer passes the half step programming word if C2='1' or the zero ('0') to the subtractor #2. It implements the half and full step counter increment operations of the SSLAR ADC algorithm. Half of the step code word is attained by taking upper 6 bit of the original step program word as 2-to-1 multiplexer inputs. C2 signal is generated by the CONT unit. CONT FSM was designed such a way that half step word is not subtracted from the first subtraction unit outputs (W4) during the first look-ahead operation at which CAL-FAL outputs (W1) equal to "00000001" and first subtractor output (W4) is "00000000".

Figure 23:
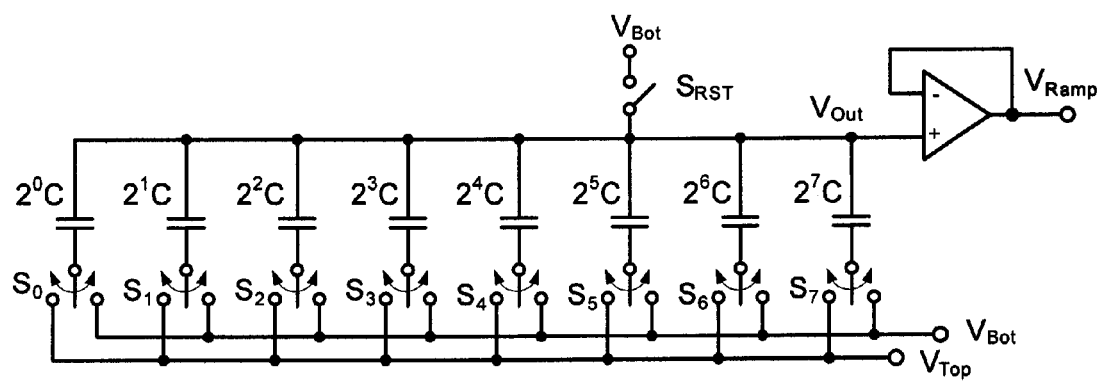
FIG. 23 is a circuit diagram of an 8-bit binary weighted capacitive DAC.

An 8-bit binary weighted capacitive digital-to-analog converter is used as ramp generator. Circuit diagram of the ramp generator is shown in FIG. 23.

Figure 24:
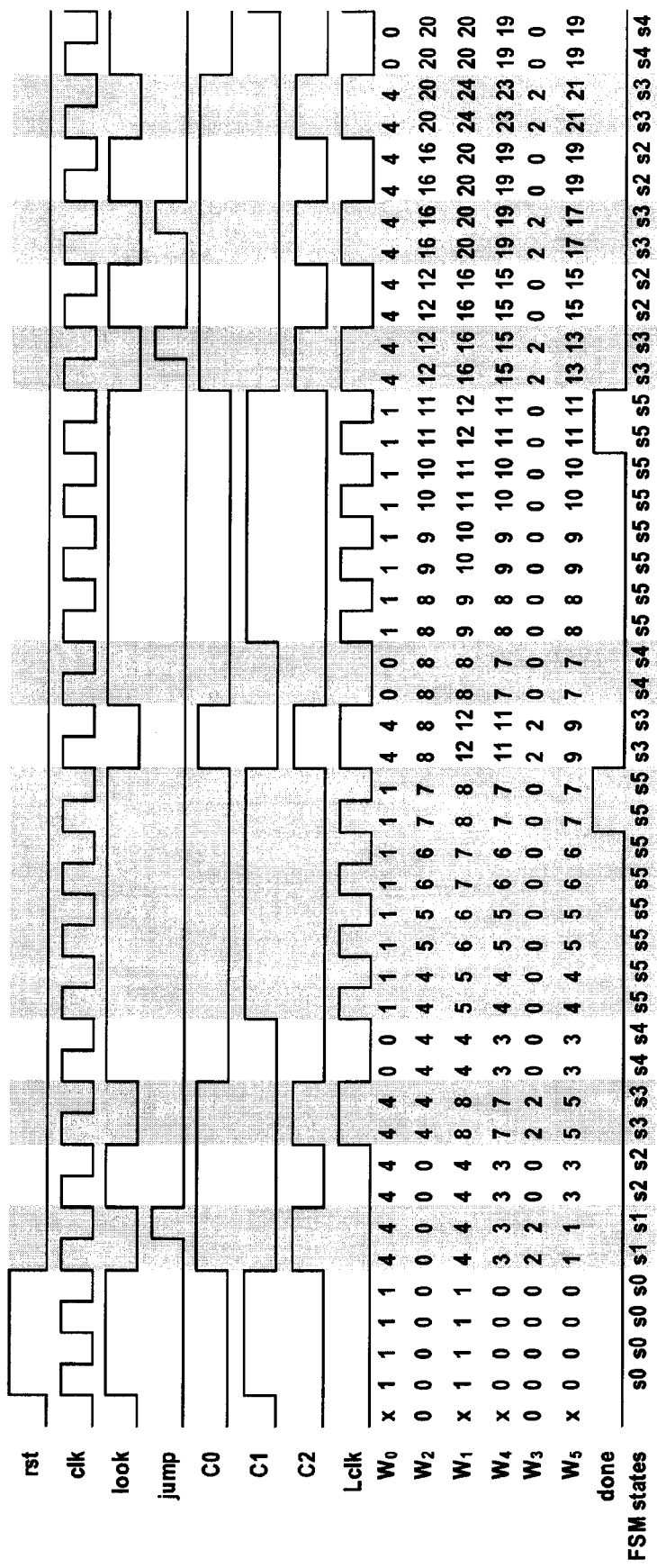
FIG. 24 is a timing diagram showing the timing of the SSLAR ADC controller and ramp-count unit with a step of 4 LSB.
Figure 25:
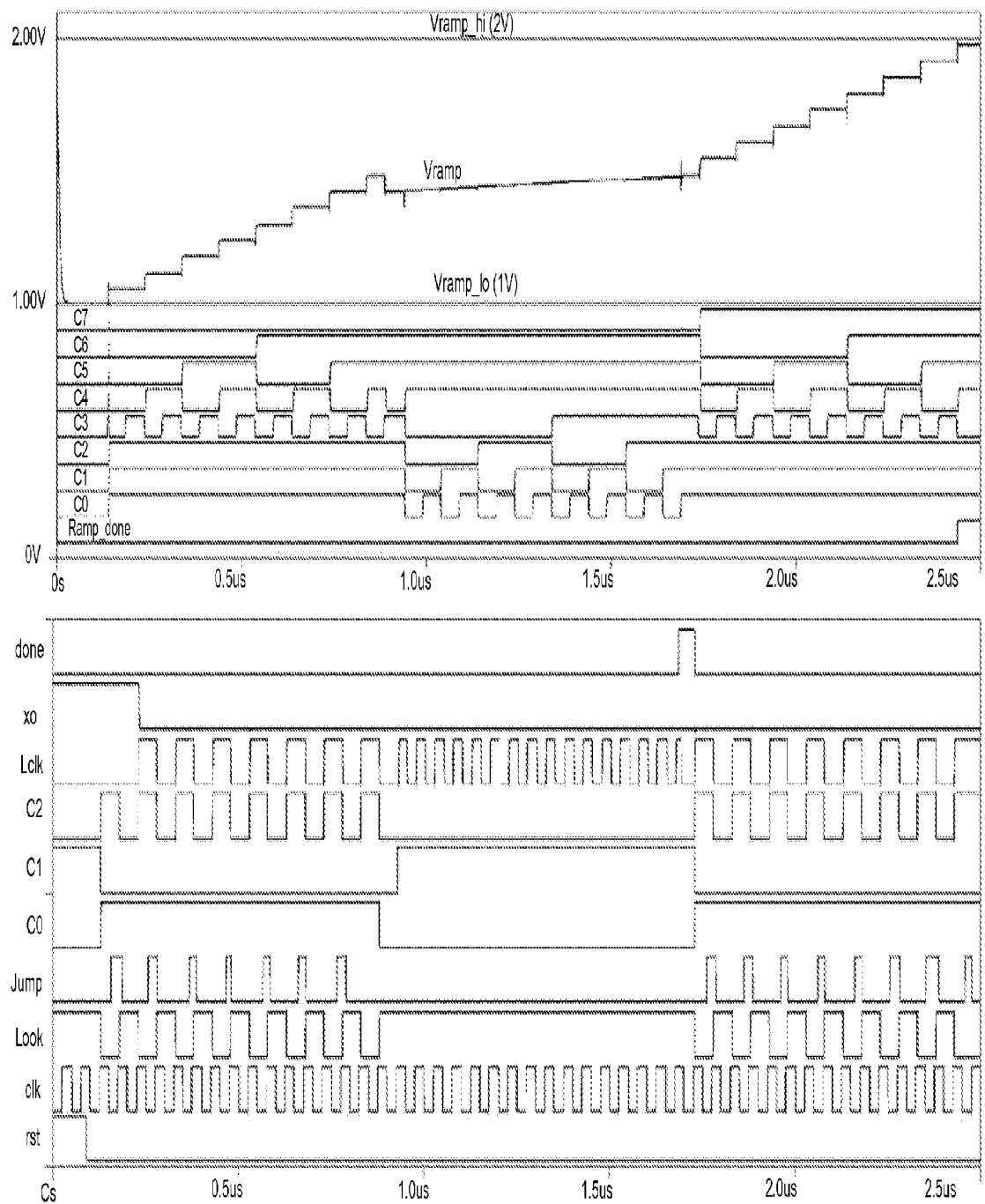
FIG. 25 is a timing diagram showing simulation results of the SSLAR ADC's controller and ramp-count generator unit with a step of 16 LSB.
Figure 26:
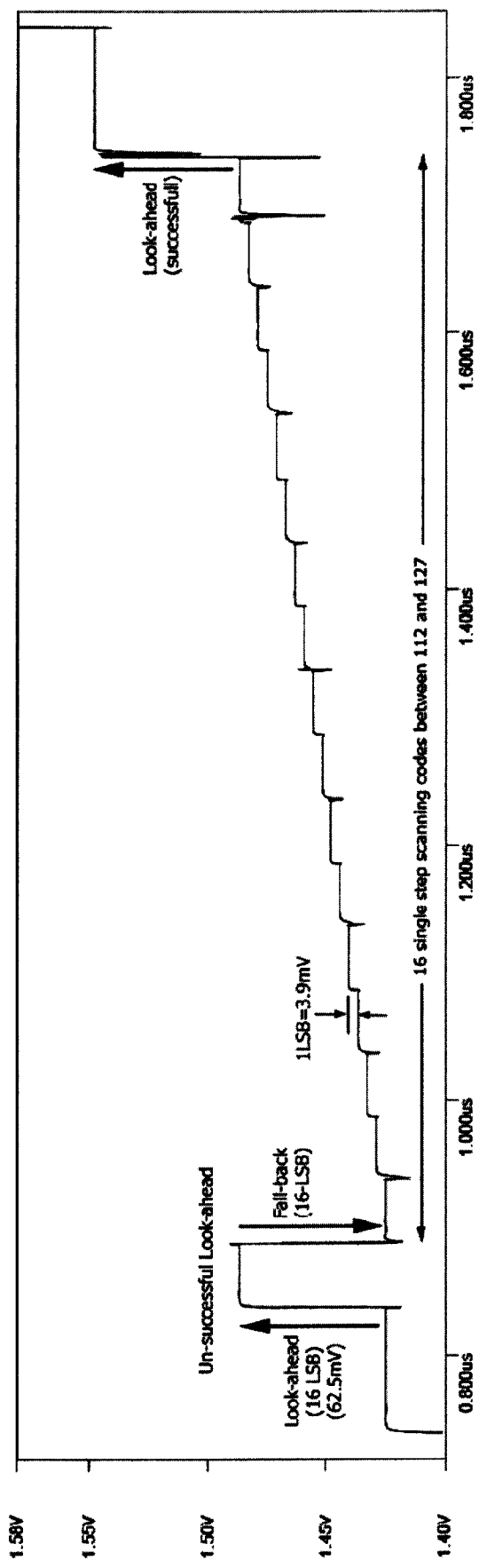
FIG. 26 shows a simulation result for a ramp output voltage for a failed look-ahead operation between codes 112 and 127.
Figure 27A:
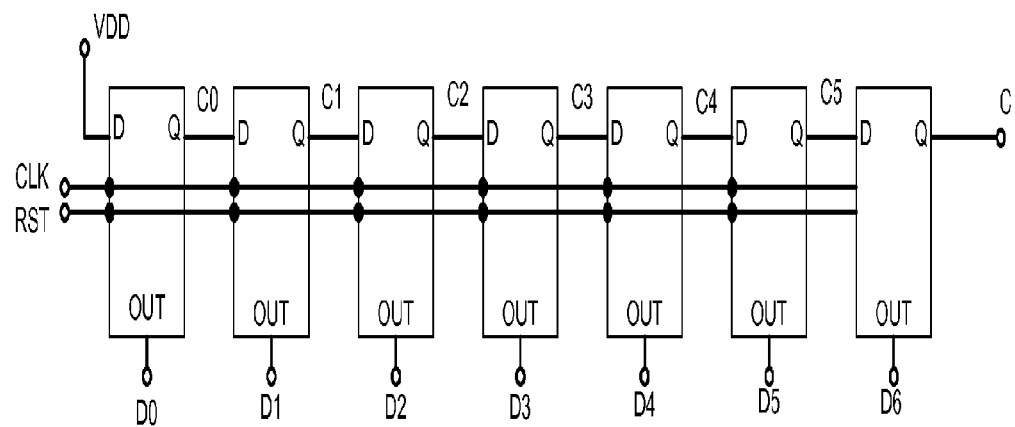
FIGS. 27A, 27B, 27C, and 27D are an embodiment of a 7-bit synchronous counter, a one-bit counter slice; a circuit diagram of the XOR gate, and the circuit diagram of an edge triggered D-type flip flop with reset.
Figure 27D:
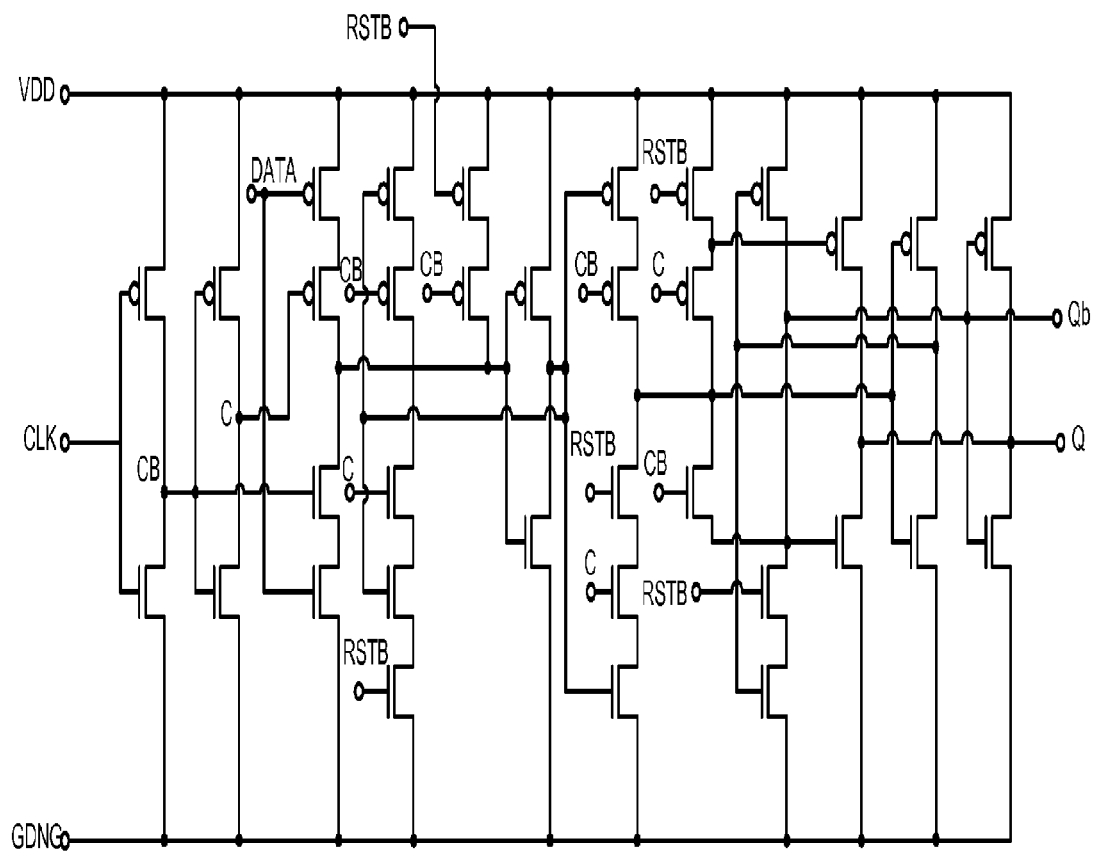
Figure 27B:
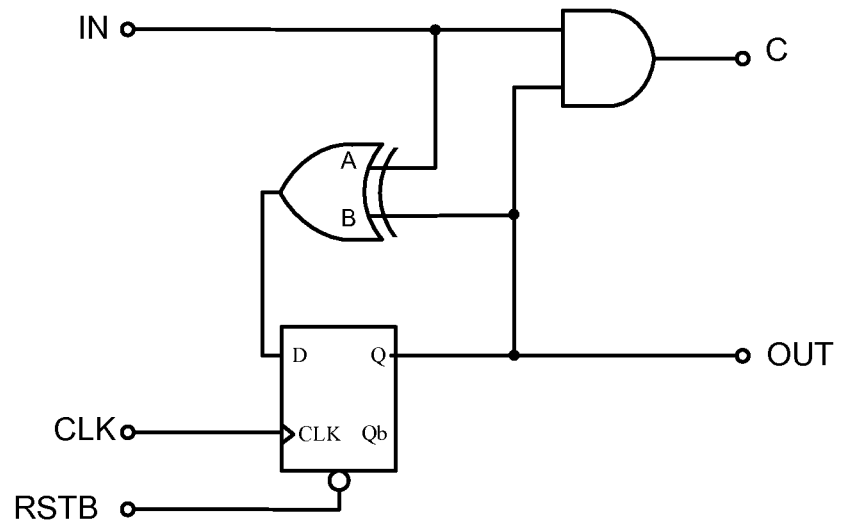
Figure 27C:
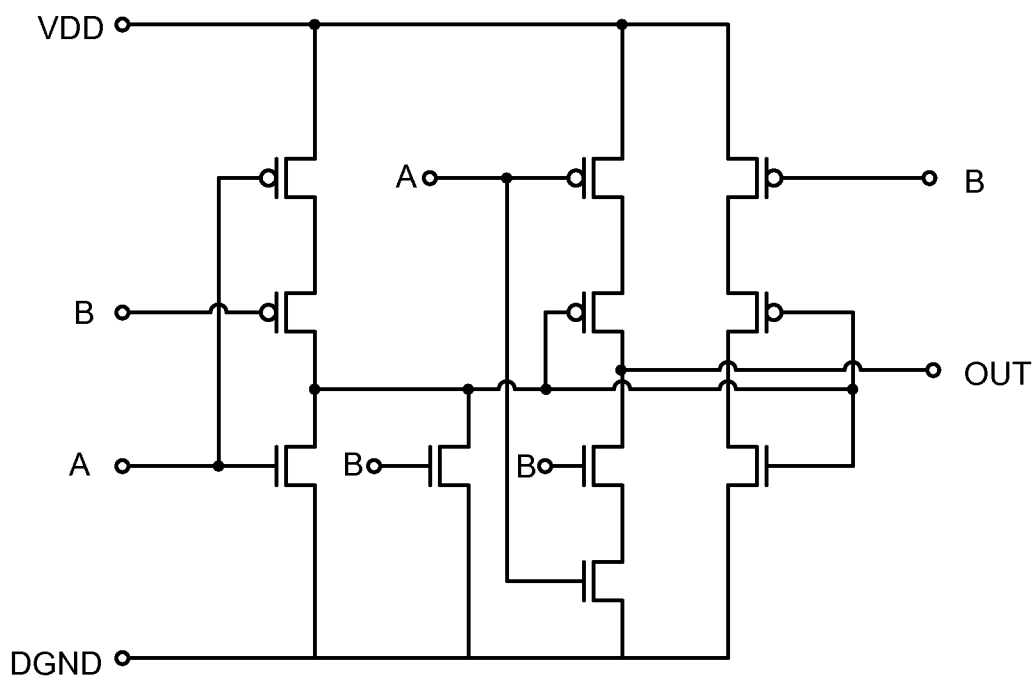
Figure 28:
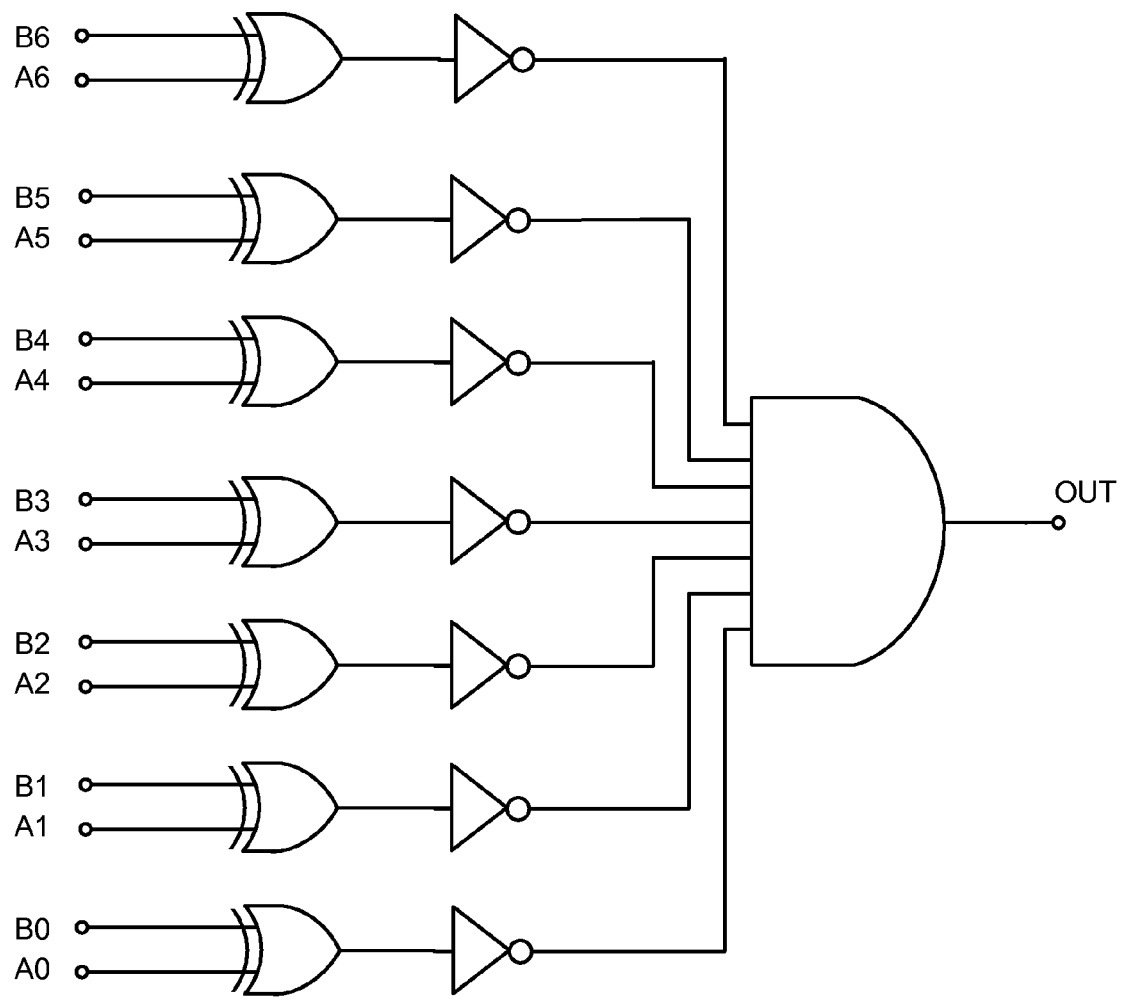
FIG. 28 is a circuit diagram of a 7-bit digital comparator.

Full operation of the CONT and RCG blocks with simulated jump input from ED block can be traced in FIG. 24. Full 8-bit SSLAR ADC simulation result for step size 16-LSB is shown in FIG. 25. In the simulation, jump input is forced to allow code jump operation all but one 16-LSB code range between 112 (01110000) and 127 (01111111). Ramp low and ramp high levels were set to 1.0 and 2.0 volt. Zoomed version of the Vramp signal is shown in FIG. 26. The single LSB is 3.906 mV (=(2V−1V)/256).

SSLAR ADC Finite State Machine Synthesis

At each state, different control signals are generated for the ramp generator and counter blocks as shown in the Table 1. Next state diagram of the FSM is shown in Table 2. Next state diagram is used for synthesizing the FSM using rising edge triggered D-type flip-flops (DFF). DFF was preferred due to the fact that the next state is depending on the data (D) input of the flip flop, and does not require alteration of the next states during synthesis.

Since number of states is less than 8, three DFF is used. For each DFF's input (D0, D1, D2), synthesis was performed assuming reset signal is low (0) while the other five control signals are the signals: done, jump, q0, q1, and q2. Signals qi are the outputs of the DFFs representing previous state. A 5-variable.

Karnaugh map (K-map for short) was constructed for the input signals of the DFFs. They are shown in Table 3.

Minimized functions of the D inputs of the DFFs based on the K-map in Table 2 are shown in FIG. 29A. They are optimized for compact implementation and the functions are shown in FIG. 29B. Functions shown in FIG. 29B were used for implementation.

Figure 30:
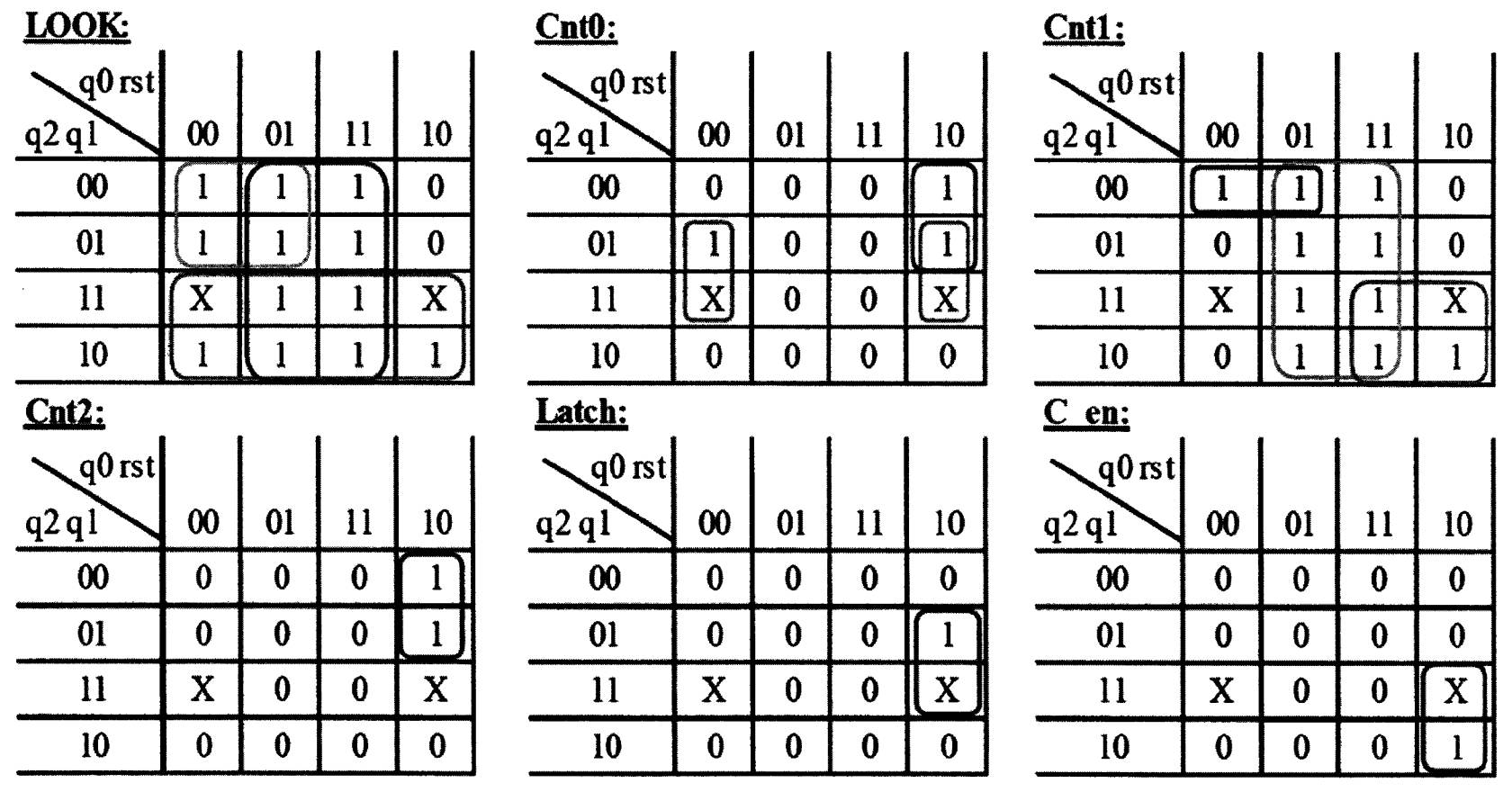

State dependent FSM outputs listed in FIG. 17 are synthesized based on the four control signals generated by the FSM. K-map of the signal dependencies and grouping is shown in the FIG. 30. Implementation and optimized values of the 6 output signals are shown in FIG. 31.

TABLE 1

State assigned output signals

| State | q2 | q1 | q0 | Look | Cnt0 | Cnt1 | Cnt2 | Latch | C_en | rst |
|---|---|---|---|---|---|---|---|---|---|---|
| Sx | X | X | X | 1 | 0 | 1 | 0 | 0 | 0 | 1 |
| S0 | 0 | 0 | 0 | 1 | 0 | 1 | 0 | 0 | 0 | 0 |

TABLE 1-continued

State assigned output signals

| State | q2 | q1 | q0 | Look | Cnt0 | Cnt1 | Cnt2 | Latch | C_en | rst |
|---|---|---|---|---|---|---|---|---|---|---|
| S1 | 0 | 0 | 1 | 0 | 1 | 0 | 1 | 0 | 0 | 0 |
| S2 | 0 | 1 | 0 | 1 | 1 | 0 | 0 | 0 | 0 | 0 |
| S3 | 0 | 1 | 1 | 0 | 1 | 0 | 1 | 1 | 0 | 0 |
| S4 | 1 | 0 | 0 | 1 | 0 | 0 | 0 | 0 | 0 | 0 |
| S5 | 1 | 0 | 1 | 1 | 0 | 1 | 0 | 0 | 1 | 0 |
| S6 | 1 | 1 | 0 | x | x | x | x | x | x | 0 |
| S7 | 1 | 1 | 1 | x | x | x | x | x | x | 0 |

TABLE 2

Current and next state diagram of the FSM

| Current States | | Next States | | | | |
|---|---|---|---|---|---|---|
| | | rst = 0 jump . done | | | | |
| State | q2 q1 q0 | 00 | 01 | 10 | 11 | rst = 1 |
| S0 | 000 | 001 | 001 | 001 | 001 | 000 |
| S1 | 001 | 100 | 100 | 010 | 010 | 000 |
| S2 | 010 | 011 | 011 | 011 | 011 | 000 |
| S3 | 011 | 100 | 100 | 010 | 010 | 000 |
| S4 | 100 | 101 | 101 | 101 | 101 | 000 |
| S5 | 101 | 101 | 011 | 101 | 011 | 000 |
| S6 | 110 | X | X | X | X | 000 |
| S7 | 111 | X | X | X | X | 000 |

TABLE 3

K-map for the three input of the DFF and grouping for implementation

D0:

| | done = 0 | | | | done = 1 | | | |
|---|---|---|---|---|---|---|---|---|
| | q0 jump | | | | q0 jump | | | |
| q2 q1 | 00 | 01 | 11 | 10 | 00 | 01 | 11 | 10 |
| 00 | 1 | 1 | 0 | 0 | 1 | 1 | 0 | 0 |
| 01 | 1 | 1 | 0 | 0 | 1 | 1 | 0 | 0 |
| 11 | X | X | X | X | X | X | X | X |
| 10 | 1 | 1 | 1 | 1 | 1 | 1 | 1 | 1 |

D1:

| | done = 0 | | | | done = 1 | | | |
|---|---|---|---|---|---|---|---|---|
| | q0 jump | | | | q0 jump | | | |
| q2 q1 | 00 | 01 | 11 | 10 | 00 | 01 | 11 | 10 |
| 00 | 0 | 0 | 1 | 0 | 0 | 0 | 1 | 0 |
| 01 | 1 | 1 | 1 | 0 | 1 | 1 | 1 | 0 |
| 11 | X | X | X | X | X | X | X | X |
| 10 | 0 | 0 | 0 | 0 | 0 | 0 | 1 | 1 |

D2:

| | done = 0 | | | | done = 1 | | | |
|---|---|---|---|---|---|---|---|---|
| | q0 jump | | | | q0 jump | | | |
| q2 q1 | 00 | 01 | 11 | 10 | 00 | 01 | 11 | 10 |
| 00 | 0 | 0 | 0 | 1 | 0 | 0 | 0 | 1 |
| 01 | 0 | 0 | 0 | 1 | 0 | 0 | 0 | 1 |
| 11 | X | X | X | X | X | X | X | X |
| 10 | 1 | 1 | 1 | 1 | 1 | 1 | 0 | 0 |

FSM is the core of the SSLAR ADC control unit that manages the SSLAR ADC algorithm. Generated signal allow SSLAR ADC's ramp generator to generate ramp and counter signals to the column comparators. Controller unit allows fully programmable step size and allows fully programmable step size working with the SSLAR ADC ramp-count unit. In the design shown in FIG. 20, 7 bit step programmability was included in the SSLAR ADC controller unit using 7 bits digital synchronous counter and digital comparator unit along with the controller FSM unit.

CLA FAL unit is followed by an 8-bit subtraction unit. 8-bit CLA FAL unit generates the counter word for the ramp and column latch circuits. An example containing full operation timing of the controller and ramp-count generator unit are shown in FIG. 24 using signal names in FIG. 20, FIG. 21, and FIG. 22. For the timing example, step size was set to 4-LSB. 2 master clock cycles are spent for each code look-ahead operation in SSLAR ADC.

Figure 32B:
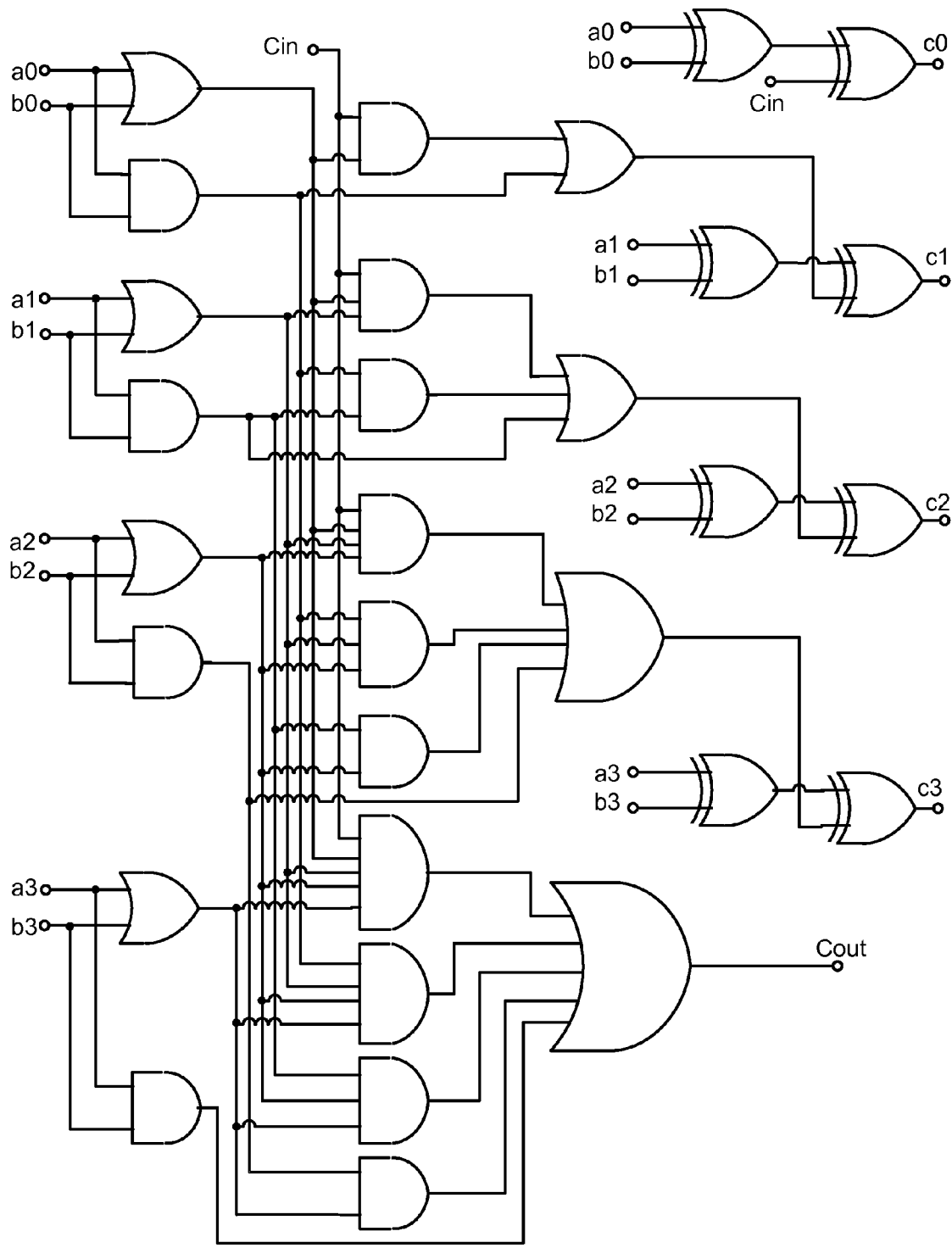

Carry-Look Ahead Full Adder Circuits 8-bit carry-look ahead (CLA) full adder (FA) includes two cascaded 4-bit CLA-FA units as shown in FIG. 32A. Each 4-bit CLA FA composes of 4-bit look-ahead circuits and the 4 full adder units as shown in FIG. 32B.

Figure 33A:
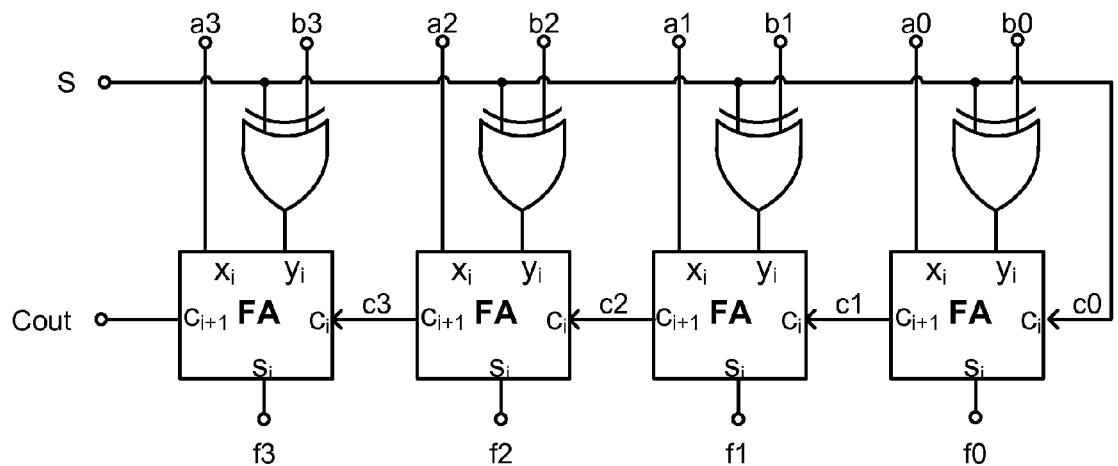
FIGS. 33A, 33B, and 33C are a 4-bit subtraction unit, a full adder circuit and a full-adder symbol.
Figure 33B:
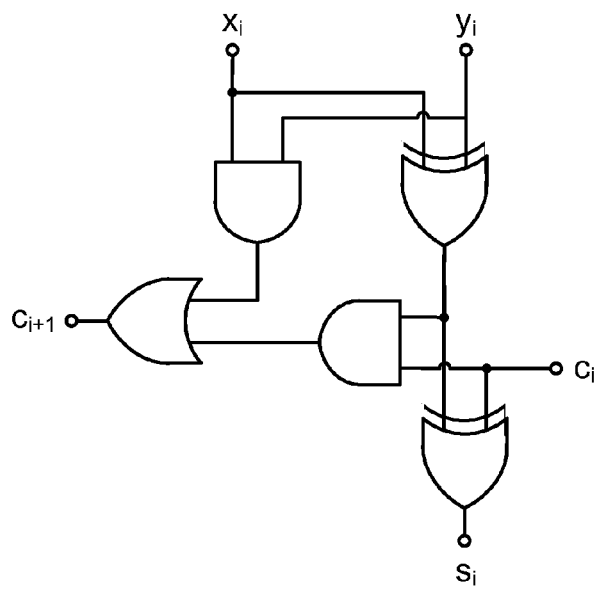
Figure 33C:
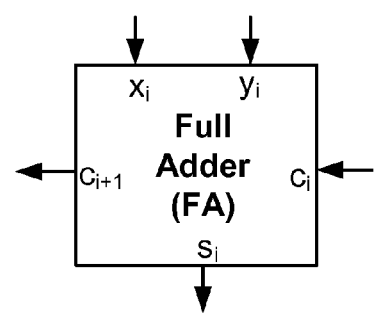

Subtraction unit composes of two cascaded 4-bit subtraction unit as shown in FIG. 33[a].

It will be recognized that the circuits described herein are only examples that can be implemented in a variety of ways. For example, the look-ahead controller 530, the predictor circuits 520, the ramp generator 508 and counter 540 can be implemented using a variety of designs. The particular circuits are only illustrative of possible designs.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope of these claims.

I claim:

1. An analog-to-digital converter, comprising:
a ramp generator for providing a substantially ramped output voltage;
a plurality of comparators, each having a first input coupled to the ramp generator, a second input coupled to a respective analog input voltage to be converted to digital, and a respective comparator output;
a plurality of latches coupled to the comparator outputs;
a counter coupled to the latches for latching a counter count in response to the comparator outputs;
a look-ahead controller coupled to the outputs of the comparators, the ramp generator, and the counter, the look-ahead controller generating a signal causing a step in the ramped output voltage and an associated change in the counter count and for detecting changes in the comparator outputs in response to the step in the ramped output voltage; and
a predictor circuit coupled between each comparator output and the look-ahead controller, wherein the predictor circuit includes a capacitor coupled at a first end to the respective comparator output and at a second end to the look-ahead controller.

2. The analog-to-digital converter of claim 1, wherein each predictor circuit is coupled to a shared line that is used as input to the look-ahead controller.

3. The analog-to-digital converter of claim 1, wherein the analog input voltages are provided from image sensors.

4. The analog-to-digital converter of claim 1, wherein the look-ahead controller includes a look-ahead comparator having a first input coupled to a reference voltage, a second input coupled as a shared line to the plurality of comparator outputs, and wherein the look-ahead comparator output is the jump signal line.

5. The analog-to-digital converter of claim 1, wherein the ramp generator is programmable.

* * * * *